United States Patent [19]

Tanaka et al.

[11] Patent Number: 4,770,961

[45] Date of Patent: Sep. 13, 1988

[54] LIGHT SENSITIVE MATERIALS FOR LITHOGRAPHIC PRINTING PLATES

[75] Inventors: Akira Tanaka; Eiji Kanada; Yoshikazu Takaya; Masahiko Saikawa; Hidetoshi Miura, all of Nagaokakyo, Japan

[73] Assignee: Mitsubishi Paper Mills, Ltd., Tokyo, Japan

[21] Appl. No.: 925,103

[22] Filed: Oct. 30, 1986

[30] Foreign Application Priority Data

| | | | |
|---|---|---|---|
| Oct. 30, 1985 | [JP] | Japan | 60-244880 |
| Oct. 31, 1985 | [JP] | Japan | 60-245059 |
| Oct. 31, 1985 | [JP] | Japan | 60-245060 |
| Oct. 31, 1985 | [JP] | Japan | 60-245061 |
| Oct. 31, 1985 | [JP] | Japan | 60-245062 |
| Dec. 13, 1985 | [JP] | Japan | 60-280426 |
| Dec. 16, 1985 | [JP] | Japan | 60-284046 |

[51] Int. Cl.[4] ........ G03C 5/54; G03C 1/485

[52] U.S. Cl. ........ 430/14; 430/204; 430/230; 430/573; 430/575; 430/576; 430/578; 430/584; 430/944

[58] Field of Search ........ 430/204, 230, 944, 578, 430/584, 573, 575, 576, 14

[56] References Cited

U.S. PATENT DOCUMENTS

| | | | |
|---|---|---|---|
| 2,276,554 | 3/1942 | Wilmanns et al. | 430/578 |
| 3,379,727 | 4/1968 | Riester | 430/578 |
| 3,600,183 | 8/1971 | Philippaerts et al. | 430/578 |
| 3,743,510 | 7/1973 | Nakazawa et al. | 430/578 |
| 4,501,811 | 2/1985 | Saikawa et al. | 430/230 |
| 4,596,767 | 6/1986 | Mihara et al. | 430/584 |
| 4,619,893 | 10/1986 | Takagi et al. | 430/204 |
| 4,677,053 | 6/1987 | Mihara et al. | 430/584 |

*Primary Examiner*—Richard L. Schilling

*Attorney, Agent, or Firm*—Cushman, Darby & Cushman

[57] ABSTRACT

Disclosed is a light sensitive material for lithographic printing plate which comprises a support and at least a silver halide emulsion layer and a surface physical development nuclei layer provided on said support wherein said silver halide emulsion layer contains at least one of the sensitizing dyes represented by the following general formulas (I), (II), (III), (IV) and (V):

General formula (I)

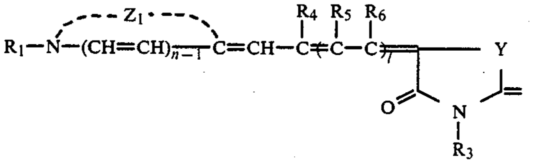

(I)

-continued

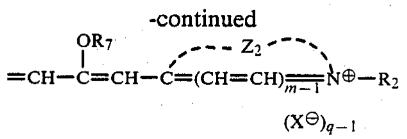

General formula (II)

(II)

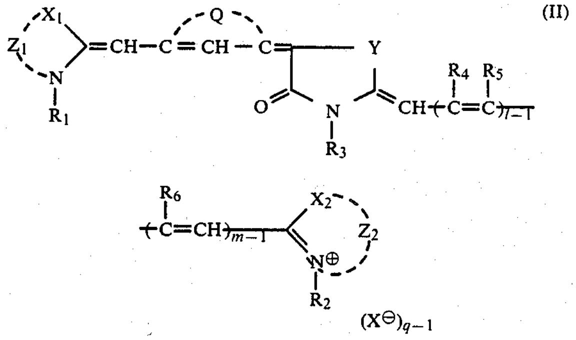

General formula (III)

(III)

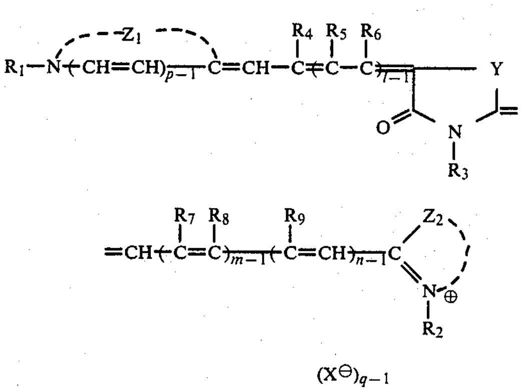

General formula (IV)

(IV)

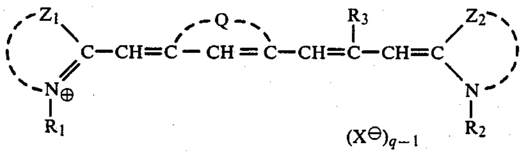

(V)

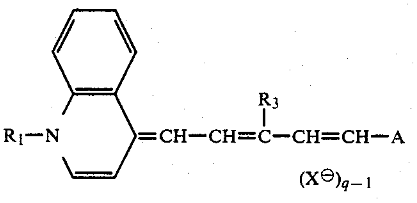

17 Claims, No Drawings

LIGHT SENSITIVE MATERIALS FOR LITHOGRAPHIC PRINTING PLATES

This invention relates to a silver halide photographic light sensitive material and more particularly it relates to a silver halide photographic light sensitive material which is spectrally sensitized for near-infrared region by specific dyes.

This invention is especially directed to a lithographic printing plate which utilizes the silver complex diffusion transfer process suitable for using semiconductor laser (or laser diode) beam as a light source and a plate making method and a printing method using said lithographic printing plate.

Lithographic printing plates which use transferred silver images formed by the silver complex diffusion transfer process as ink receptive areas are disclosed in Japanese Patent Examined Publication (Kokoku) No. 30562/73 and Japanese Patent Unexamined Publication (Kokai) Nos. 21602/78, 103104/79, 9750/81, etc. and they are well known.

According to a typical silver complex diffusion transfer process suitable for making these lithographic printing plates, a light sensitive material which comprises a support and a subbing layer which serves also as an anti-halation layer, a silver halide emulsion layer and a physical development nuclei layer provided on said support is exposed imagewise and developed, whereby silver halide of latent image area becomes black silver in the emulsion layer and simultaneously silver halide of non-latent image area is dissolved by the action of a silver halide complexing agent contained in a processing solution and diffuses to the surface of the light sensitive material. Thus dissolved and diffusing silver complex salt is deposited as silver image on the physical development nuclei in the surface layer by reducing action of developing agent. Following the development, if necessary, the material is subjected to a sensitizing treatment to increase ink receptivity of the silver image. Then, thus obtained lithographic printing plate was mounted on an offset printing machine and printing is carried out by transferring the inked image to a substrate.

According to the conventional method, the silver halide emulsion layer is subjected to spectral sensitization by a merocyanine or cyanine dye so that the emulsion can have a sensitivity maximum in green radiation region of near 550 nm and the emulsion is subjected to exposure for several-several ten seconds by a process camera using an ordinary light source such as tungsten light source. Such conventional method, however, has a limit even when the above-stated lithographic printing plates which are inherently excellent in sharpness and resolution are used. Besides, there are the problems that when a color print is produced from a color original, not only the resolution is still insufficient, but production of the light sensitive material and making of lithographic printing plates are complicated.

Use of laser beam for plate making has been proposed as a method for solution of the above problems. For example, lithographic printing plates to which helium-neon laser or light emitting diode is applied are disclosed in U.S. Pat. No. 4,501,811 and Japanese Patent Unexamined Publication (Kokai) Nos. 71055/84, 75838/85, 100148/85, etc. As also described in these patent documents, in the case of these lithographic printing plates which utilize the silver complex diffusion transfer process, since the surface physical development nuclei layer gives a great effect on the spectral sensitization, the objective sensitivity to laser beam is reduced or shelf stability is deteriorated and moreover, since a low contrast transfer silver image is precipitated by silver complex diffusion transfer development, sharpness and resolution are decreased and furthermore, there occur scumming of non-image area and dropout of silver image during printing, which make it impossible to obtain sufficient printing endurance. Thus, it is difficult to make the desired lithographic printing plates of good quality. Therefore, a desired sensitizing dye should meet all of the following requirements: sufficiently high sensitivity to the radiation wavelength from lasers; good shelf stability; formation of a high contrast silver image; no adverse effect such as scumming; and formation of a transferred and precipitated silver having a sufficient strength to keep even small silver particles from dropping out during printing.

As for the lasers, there are known various types, the method which uses laser sources such as helium-neon, argon, etc. as those for scanner type have the defects such as large and expensive devices required, low consumption power efficiency, etc. On the other hand, semiconductor lasers have the advantages that they are small in size and inexpensive, modulation can be easily performed and they have a long shelf life. For the semiconductor lasers, there are used such series of semiconductors as Ga/As/P, Ga/Al/As, Ga/As, In/P, In/As, etc. and wavelength of these laser beams is generally longer than 700 m$\mu$ and mostly longer than 750 m$\mu$.

Light sensitive materials for lithographic printing plates which employ such semiconductor laser beams of longer wavelength as light sources for image exposure are disclosed in Japanese Patent Unexamined Publication (Kokai) No. 61752/85. This specification mentions, as an especially preferred embodiment, a light sensitive material for lithographic printing plate which comprises a support and a non-silver light sensitive layer capable of forming an oleophilic image (for example, comprising an o-naphthoquinone compound) and a light sensitive silver halide emulsion layer provided in this order on said support and discloses sensitizing dyes represented by the general formulas (I)–(IV) used in the above emulsion layer and having a maximum spectral sensitivity in the region longer than 700 m$\mu$.

The inventors have made research on a lot of infrared rays sensitizing dyes including those specifically mentioned in the above patent specifications by adding them to the silver halide emulsion layer of the above-stated lithographic printing plates having a physical development nuclei layer as an outermost surface layer. As a result, they have found a group of sensitizing dyes which can provide a sensitivity enough to perform platemaking with semiconductor laser beam, a high resolving power and a high printing endurance.

Accordingly, one object of this invention is to provide a lithograhic printing plate having a high sensitivity which permit the use of a semiconductor laser beam of low output, a high resolving power and a high printing endurance and free from scumming, which utilizes the silver complex diffusion transfer process, a plate making method and a printing method.

Another object of this invention is to provide a spectrally sensitized silver halide photographic light sensitive material high in sensitivity to radiation of near-infrared region, less in fog and furthermore, less in reduction of sensitivity and formation of fog.

The above objects of this invention have been achieved by containing the sensitizing dyes described hereinbelow in a silver halide emulsion layer. That is, this invention relates to a light sensitive material for lithographic printing plates which comprises a support and at least a silver halide emulsion layer and a surface physical development nuclei layer provided on said support, wherein said emulsion layer contains at least one of the sensitizing dyes represented by the following general formulas (I)-(V).

General formula (I):

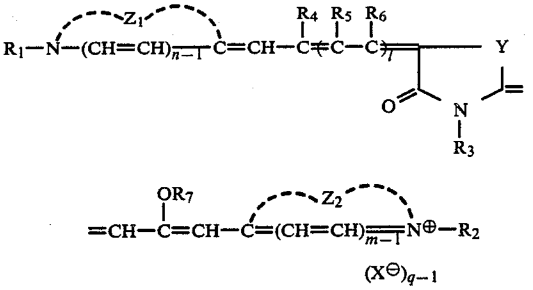

(I)

wherein $Z_1$ and $Z_2$ which may be identical or different represent a group of atoms which are necessary to form a 5- or 6-membered nitrogen containing heterocyclic ring; $R_1$, $R_2$ and $R^7$ which may be identical or different represent alkyl group or alkenyl group; $R_3$ represents alkyl group, alkenyl group or aryl group; $R_4$-$R^6$ which may be identical or different represent hydrogen atom, alkyl group or aryl group; l represents 0 or 1 with a proviso that when l is 1, $R_4$ and $R_6$ may link with each other to form a 5- or 6-membered ring; Y represents sulfur atom, oxygen atom or $>N-R_8$ ($R_8$ represents alkyl group); X represents acid anion; and m, n and q represent 1 or 2.

General formula (II):

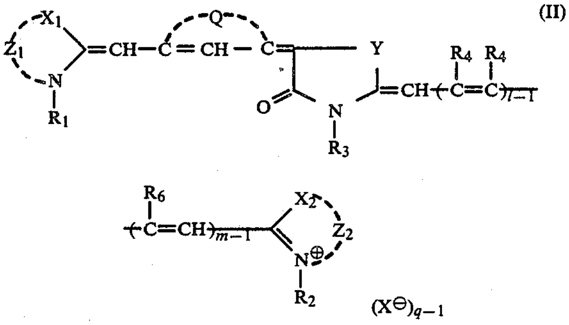

(II)

wherein $X_1$ and $X_2$ which may be identical or different represent oxygen atom, sulfur atom, selenium atom, $>N-R_7$ ($R_7$ represents an alkyl group) or

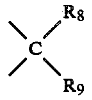

($R_8$ and $R_9$ represent alkyl group); $Z_1$ and $Z_2$ which may be identical or different represent a group of atoms necessary for forming a 5-membered nitrogen containing heterocyclic ring; $R_1$ and $R_2$ which may be identical or different represent alkyl group, or alkenyl group; $R_3$ represents an alkyl group, an alkenyl group or an aryl group; $R_4$, $R_5$ and $R_6$ which may be identical or different represent hydrogen atom, halogen atom, alkyl group or aryl group; Y represents sulfur atom, oxygen atom or $>N-R_{10}$ ($R_{10}$ represents an alkyl group); Q represents a group of atoms necessary for forming a 5- or 6-membered ring by linking with carbon atom of methine chain; X represents an acid anion, and l, m and q represent 1 or 2.

General formula (III):

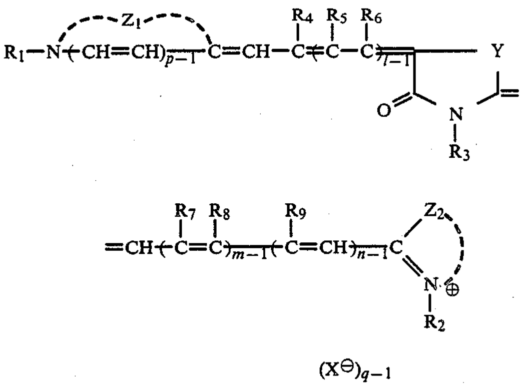

(III)

wherein $Z_1$ represents a group of atoms necessary for forming a 5- or 6-membered nitrogen containing heterocyclic ring; $Z_2$ represents a group of atoms necessary for forming a 5-membered nitrogen containing heterocyclic ring; $R_1$ and $R_2$ which may be identical or different represent alkyl group or alkenyl group; $R_3$ represents an alkyl group, an alkenyl group or an aryl group; $R_4$-$R_9$ which may be identical or different represent hydrogen atom, halogen atom, alkyl group or aryl group; Y represents sulfur atom, oxygen atom, halogen atom, alkyl group or aryl group; Y represents sulfur atom, oxygen atom, or $>N-R_{10}$ ($R_{10}$ represents an alkyl group); X represents an acid anion; l, m, n, p and q represent 1 or 2 with a proviso that when m and n are both 1, l is 2.

General formula (IV):

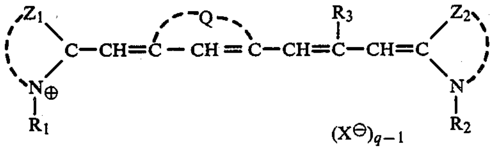

(IV)

wherein $Z_1$ and $Z_2$ which are different represent thiazole ring, selenazole ring or oxazole ring which may have a condensed ring; $R_1$ and $R_2$ which may be identical or different represent alkyl group or alkenyl group; $R_3$ represents hydrogen atom, an alkyl group or an aryl group; Q represents a group of atoms necessary for forming a 5- or 6-membered ring by linking with carbon atom of methine chain; X represents an acid anion; and Q represents 1 or 2.

General formula (V):

(V)

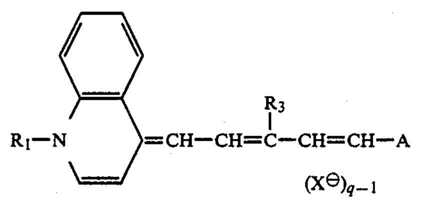

wherein A represents

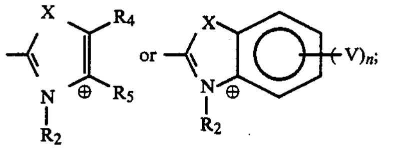

X represents sulfur atom, selenium atom, oxygen atom or >N—$R_6$ ($R_6$ represents an alkyl group); $R_4$ and $R_5$ represent hydrogen atom, alkyl group or aryl group with a proviso that $R_4$ and $R_5$ can be both hydrogen atoms; V represents an alkyl group, an alkoxy group, an aryl group, an alkoxycarbonyl group, an alkenyl group, a carboxy group, hydroxy group or a halogen atom; n represents 0 or an integer of 1–4 and when n is 0, V forms naphthothiazole ring; $R_1$ and $R_2$ represent alkyl group or alkenyl group; $R_3$ represents hydrogen atom, an alkyl group or an aryl group; X represents an acid anion; and q represens 1 or 2.

The sensitizing dyes represented by the general formula (I) and those represented by the general formula (II) are rhodacyanine dyes, characterized by having the —$OR_7$ group and the ring Q, respectively and they exhibit the best results among the dyes used in this invention.

As examples of $Z_1$ and $Z_2$ in the general formula (I), mention may be made of nitrogen containing heterocyclic rings such as thiazole, benzothiazole, naphtho[1,2-d]thiazole, naphtho[2,1-d]thiazole, naphtho[2,3-d]thiazole, selenazole, benzoselenazole, naphtho[2,1-d]selenazole, naphtho[1,2-d]selenazole, oxazole, benzoxazole, naphtho[1,2-d]oxazole, naphtho[2,1-d]oxazole, naphtho[2,3-d]oxazole, 2-quinoline, 4-quinoline, 3,3-dialkylindolenine, imidazole, henzimidazole, naphtho[1,2-d]imidazole, pyridine, etc. These heterocyclic rings may have one or more substituents such as alkyl groups (e.g., methyl, ethyl, butyl, trifluoromethyl, etc.), aryl groups (e.g., phenyl, tolyl, etc.), hydroxy group, alkoxy groups (e.g., methoxy, ethoxy, butoxy, etc.), carboxy group, alkoxycarbonyl groups (e.g., methoxycarbonyl, ethoxycarbonyl, etc.), halogen atoms (e.g., fluorine, chlorine, bromine and iodine), aralkyl groups (e.g., benzyl, phenetyl, etc.), cyano group, alkenyl groups (e.g., allyl, etc.), etc.

For $R_1$, $R_2$ and $R_7$, examples of alkyl group are lower alkyl groups such as methyl, ethyl, propyl, butyl, etc.; hydroxyalkyl groups such as β-hydroxyethyl, γ-hydroxypropyl, etc.; alkoxyalkyl groups such as β-methoxyethyl, γ-methoxypropyl, etc.; acyloxyalkyl groups such as β-acetoxyethyl, γ-acetoxypropyl, β-benzoyloxyethyl, etc.; carboxyalkyl groups such as carboxymethyl, β-carboxyethyl, etc.; alkoxycarbonylalkyl groups such as methoxycarbonylmethyl, ethoxycarbonylmethyl, β-ethoxycarbonylethyl, etc.; sulfoalkyl groups such as β-sulfoethyl, γ-sulfopropyl, δ-sulfobutyl, etc.; aralkyl groups such as benzyl, phenetyl, sulfobenzyl, etc. and examples of alkenyl group are allyl, etc.

As examples of $R_3$, mention may be made of alkyl and alkenyl groups as enumerated for the above $R_1$ and $R_2$ and phenyl, tolyl, methoxyphenyl, chlorophenyl, naphthyl, etc. as aryl groups.

For $R_4$–$R_6$, examples of alkyl and aryl groups are those enumerated for the above $R_1$ and $R_2$ and 5- or 6-membered rings formed with $R_4$ and $R_6$ may be substituted with a lower alkyl group or the like. Examples of $R_8$ are alkyl groups as enumerated for $R_1$ and $R_2$.

Examples of acid anion of X are alkylsulfate ions such as methylsulfuric acid, ethylsulfuric acid, etc., thiocyanate ion, toluenesulfonate ion, halogen ions such as chlorine, bromine, iodine, etc., perchlorate ions, etc. When the dyes have betaine analogous structure, X is absent.

l is 0 or 1 and m, n and q are 1 or 2.

In the general formula (II), as examples of $Z_1$ and $Z_2$, mention may be made of the 5-membered nitrogen containing heterocyclic rings enumerated as examples of $Z_1$ and $Z_2$ of the general formula (I) and these heterocyclic rings may have such substituents as those of $Z_1$ and $Z_2$ of the general formula (I). As examples of $R_1$–$R_3$, mention may be made of such alkyl groups, alkenyl groups and aryl groups as enumerated as examples of $R_1$–$R_3$ of the general formula (I). As examples of the alkyl and aryl groups of $R_4$–$R_6$, mention may be made of such groups as enumerated as examples of the above $R_1$ and $R_2$ and as examples of halogen atoms, mention may be made of fluorine, chlorine, bromine and iodine. Examples of alkyl group of $R_7$–$R_{10}$ are lower alkyl groups such as methyl, ethyl, etc. The ring represented by Q may be substituted with a lower alkyl group such as methyl group, etc. X is such acid anion as enumerated as examples of X of the general formula (I).

As examples of symbols in the general formulas (III)-(V), mention may be made of those enumerated as examples of those in the general formulas (I) and (II) within the scope of definitions in the general formulas (III)-(V).

Typical examples of the sensitizing dyes used in this invention are shown below.

Examples of the sensitizing dyes represented by the general formula (I).

[I-1]
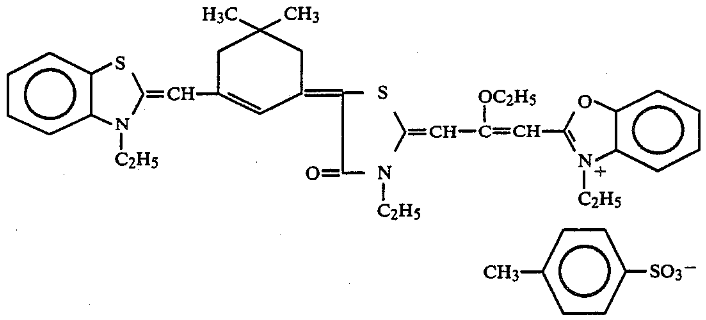
[I-2]
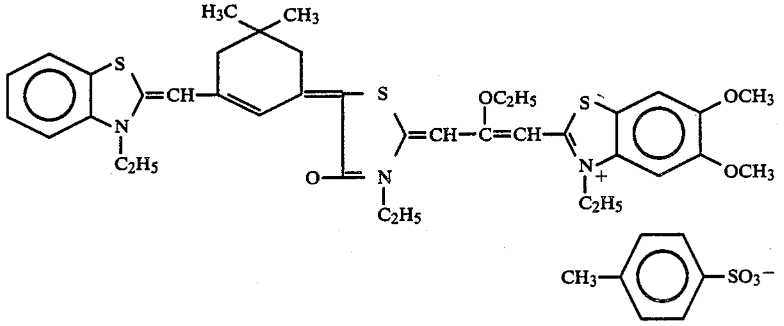
[I-3]
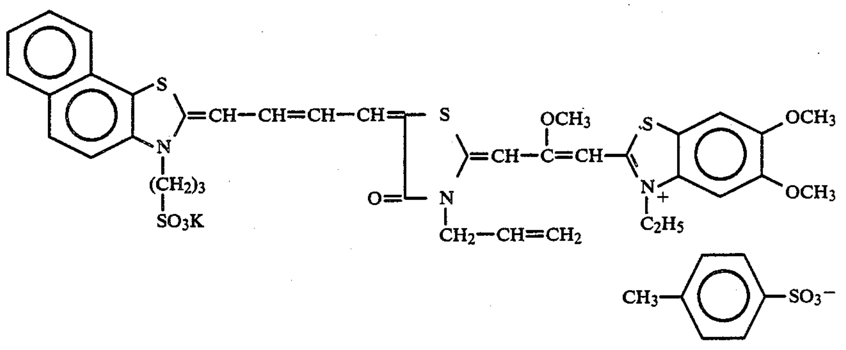
[I-4]
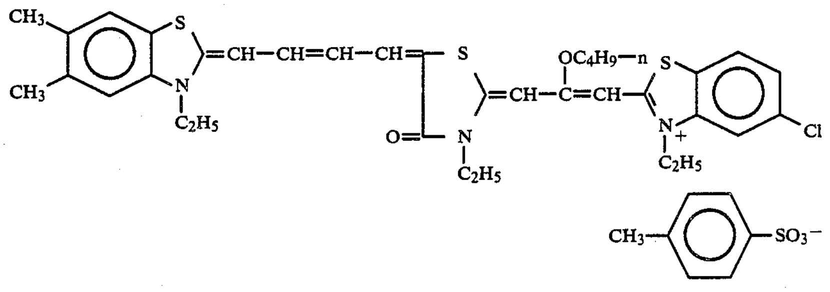

-continued
[I-5]
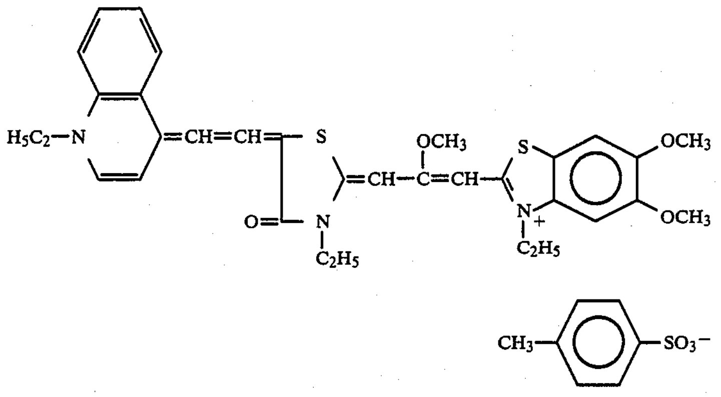
[I-6]
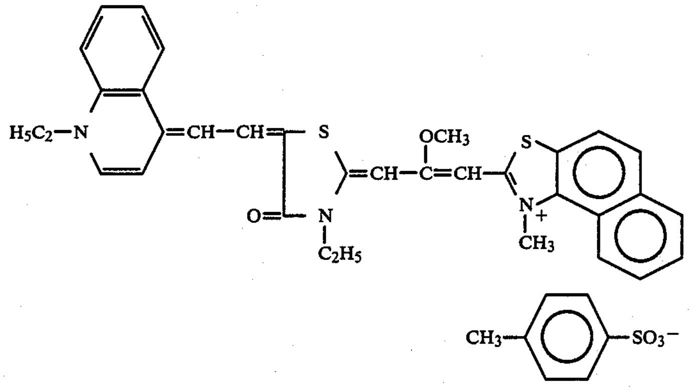
[I-7]
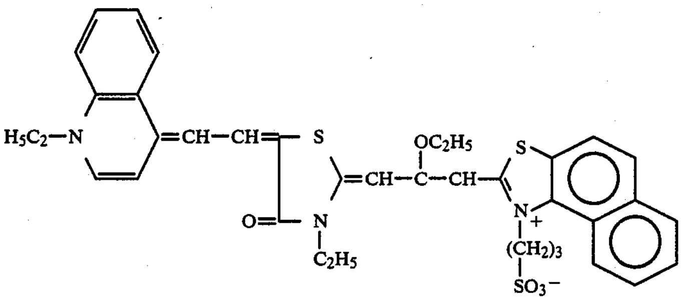
[I-8]
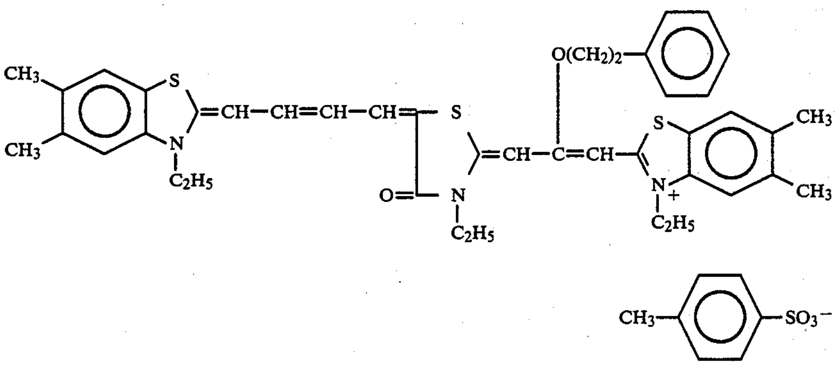

-continued
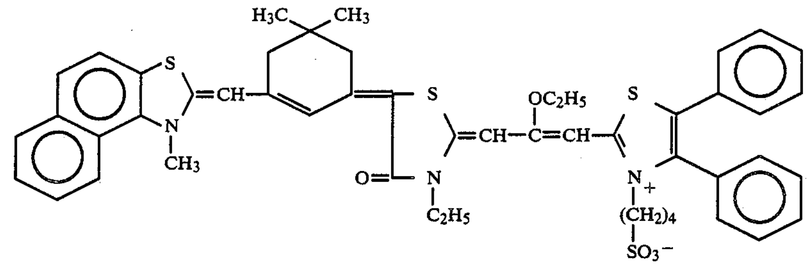
[I-9]
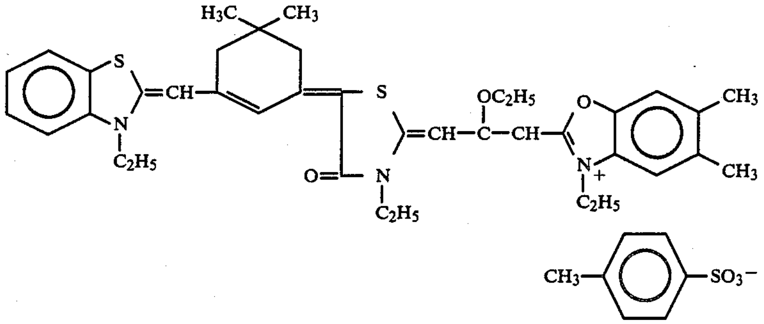
[I-10]
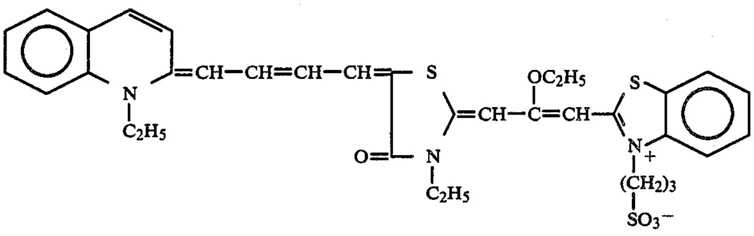
[I-11]
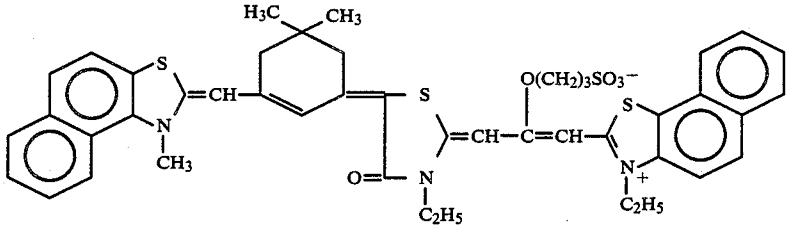
[I-12]
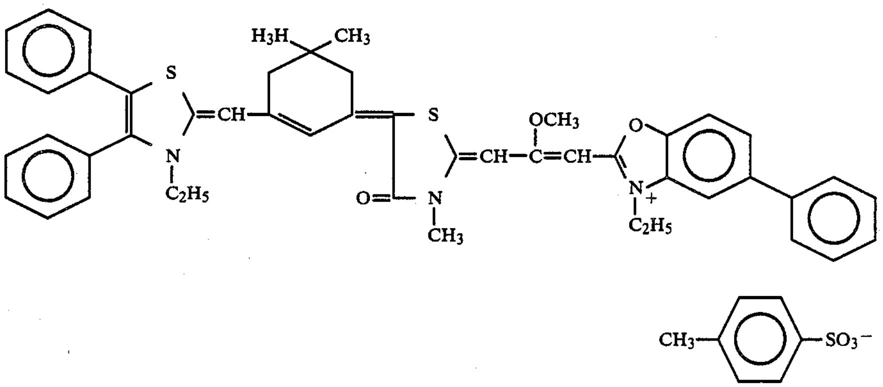
[I-13]

-continued
[I-14]
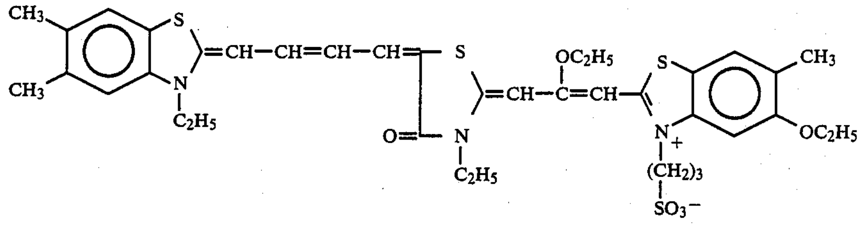
[I-15]
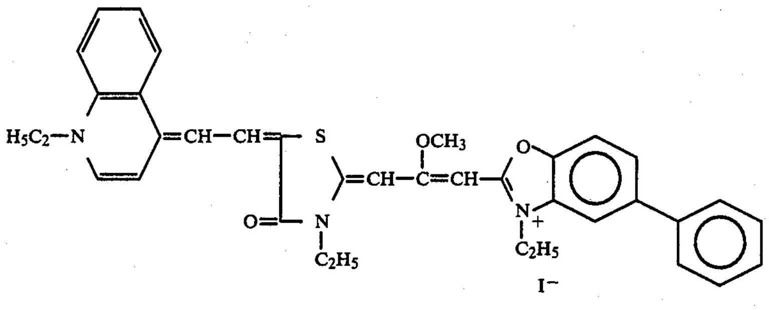
[I-16]
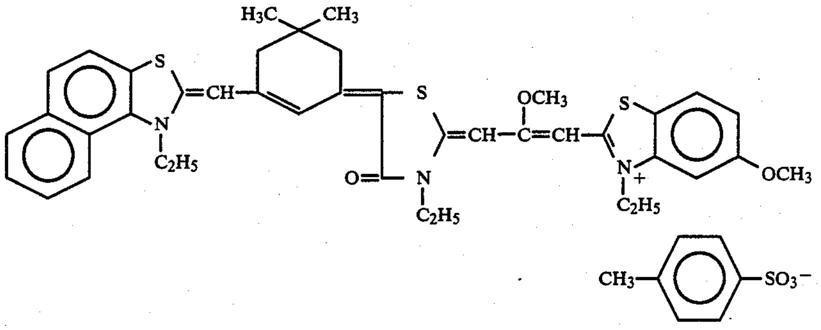
[I-17]
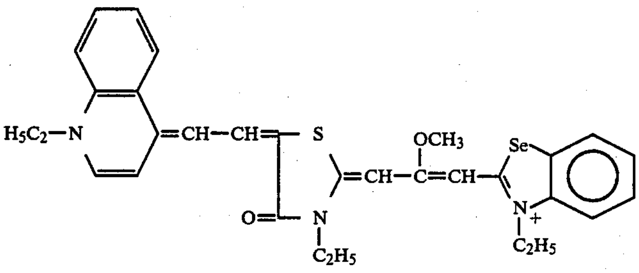
[I-18]
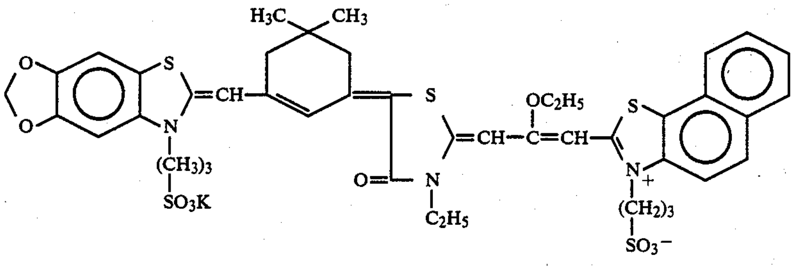

-continued
[I-19]
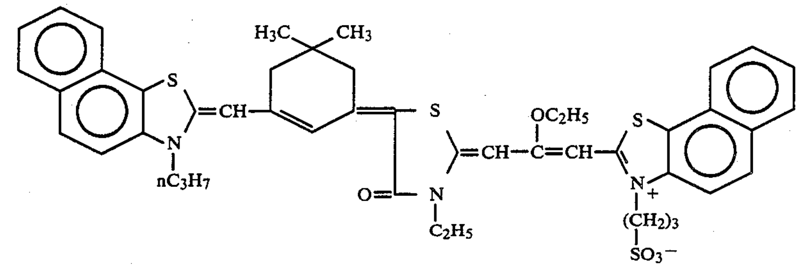
[I-20]
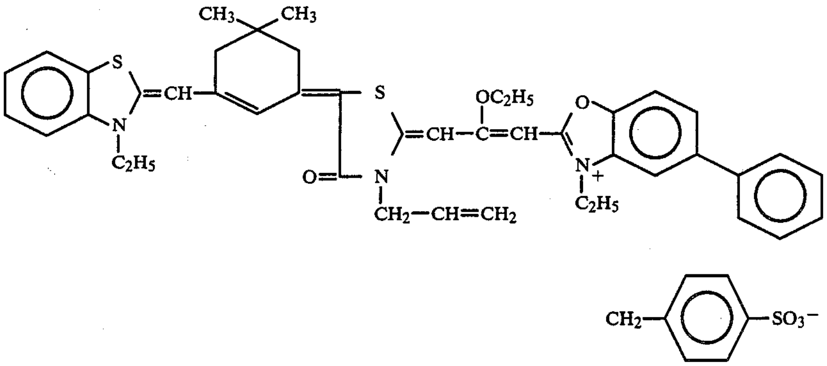
[I-21]
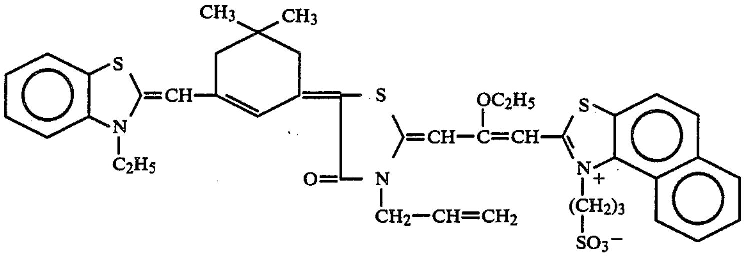
[I-22]
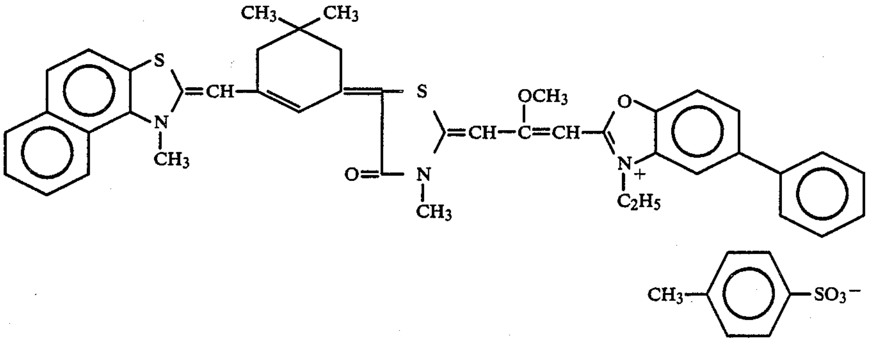
[I-23]
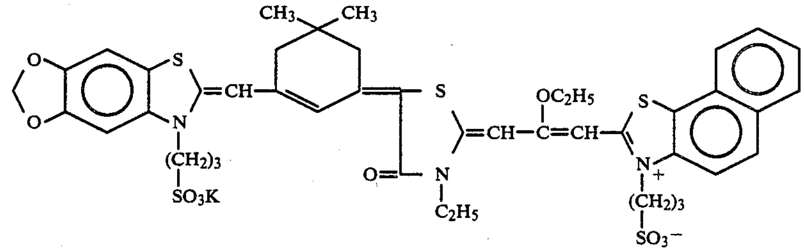

-continued
[I-24]
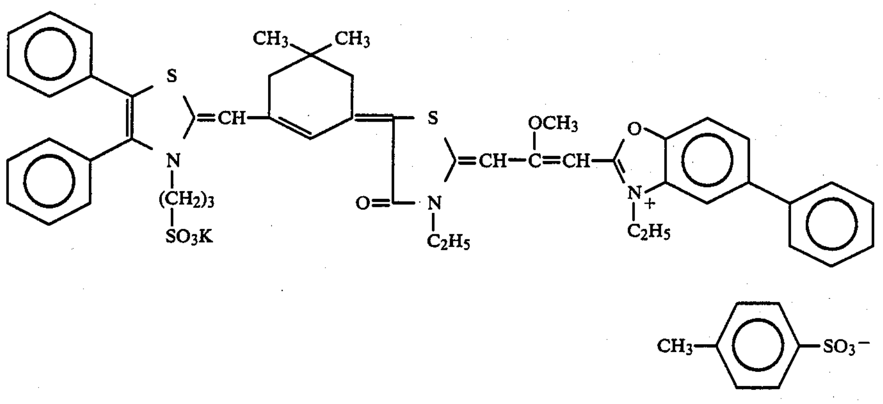
[I-25]
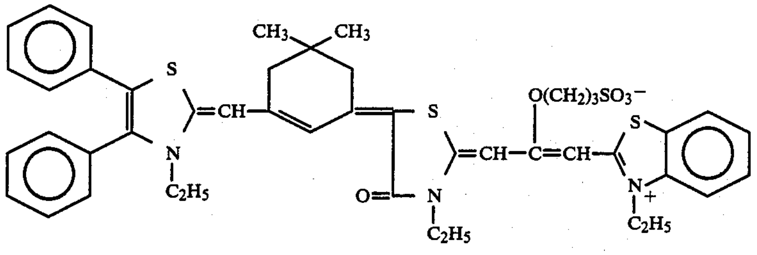
[I-26]
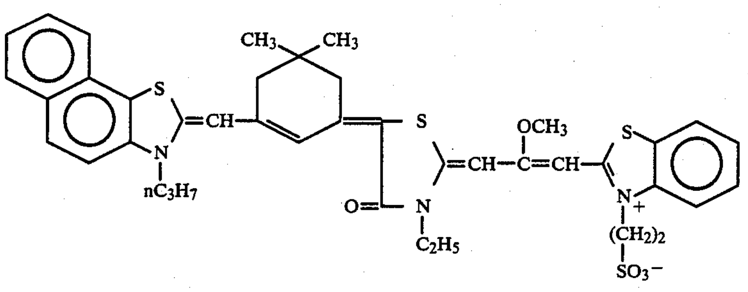
[I-27]
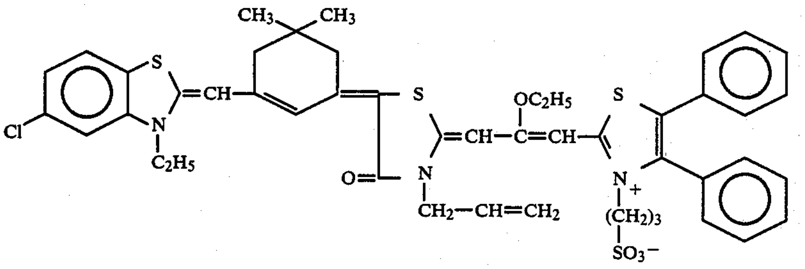
[I-28]
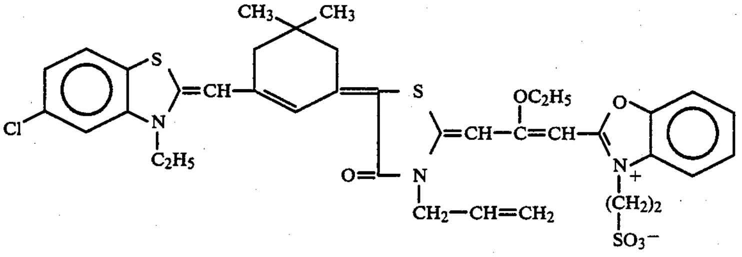

-continued
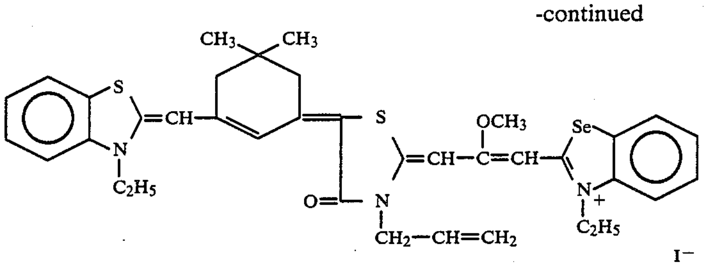
[I-29]
I⁻
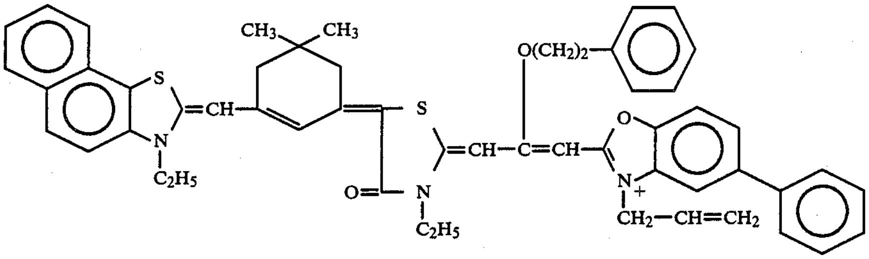
[I-30]
I⁻
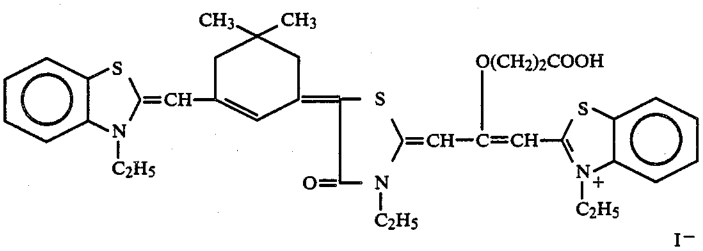
[I-31]
I⁻
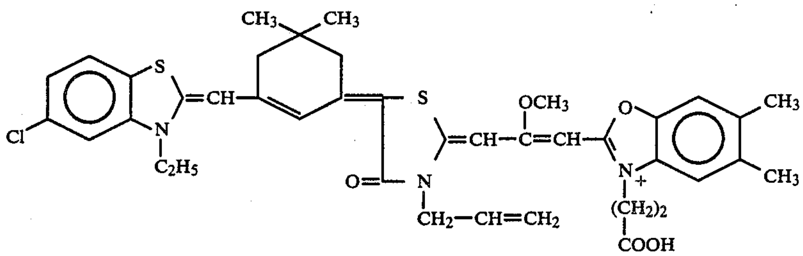
[I-32]
I⁻
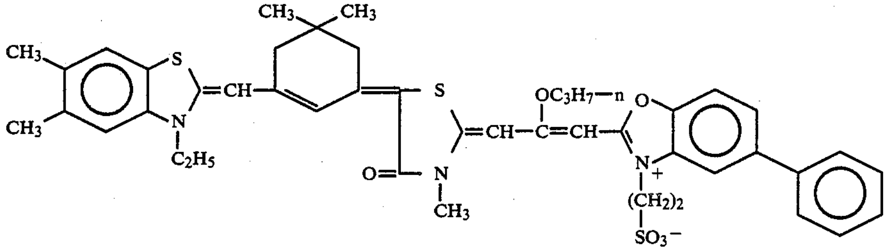
[I-33]
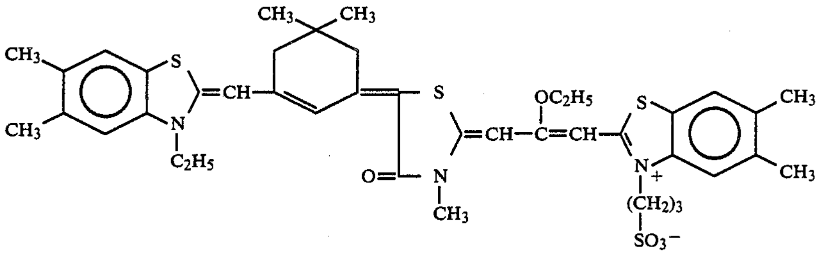
[I-34]

-continued
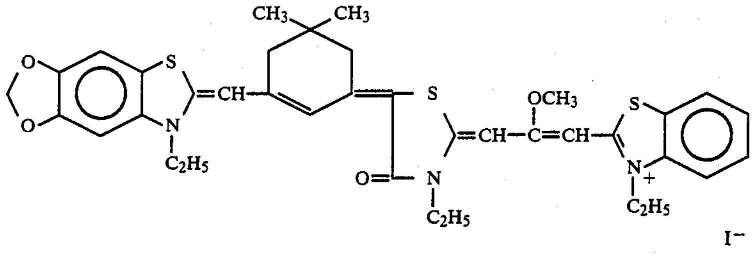
[I-35]
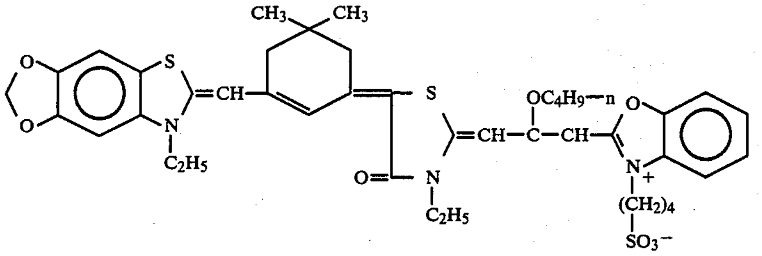
[I-36]
Examples of the sensitizing dyes represented by the general formula (II).
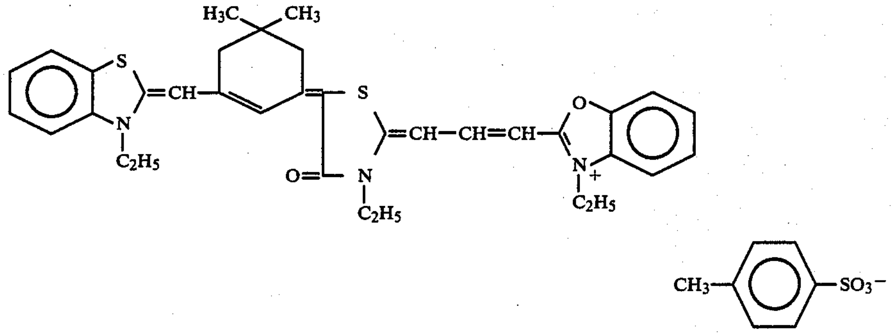
[II-1]
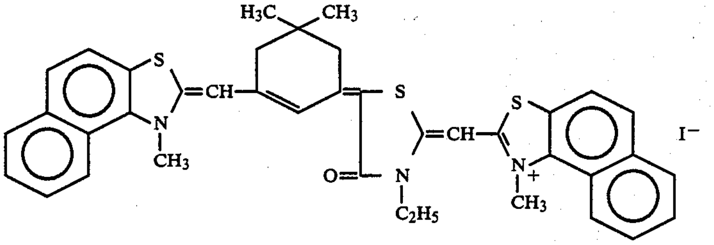
[II-2]
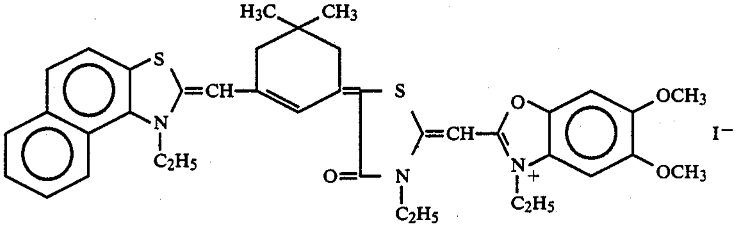
[II-3]
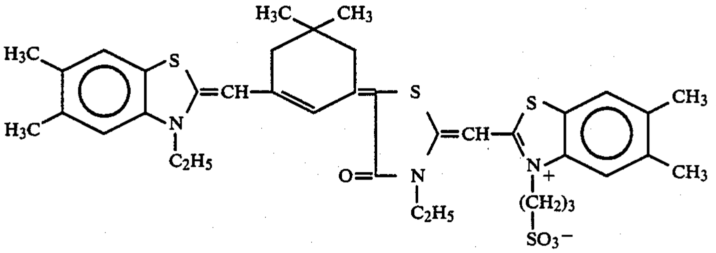
[II-4]

-continued
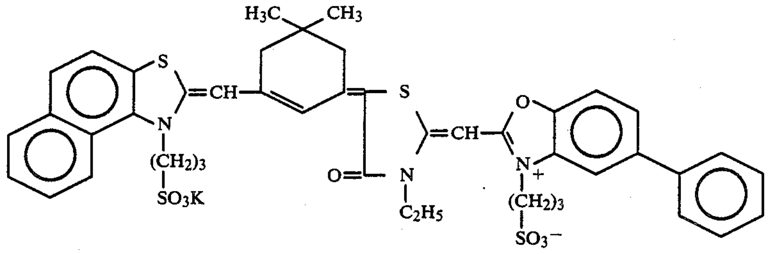
[II-5]
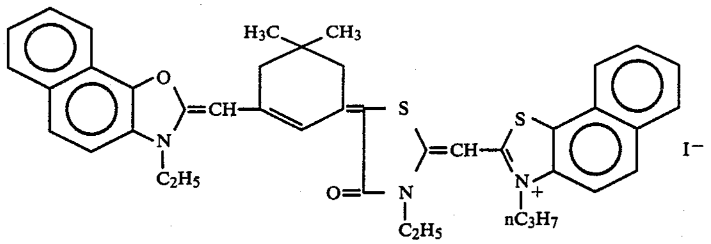
[II-6]
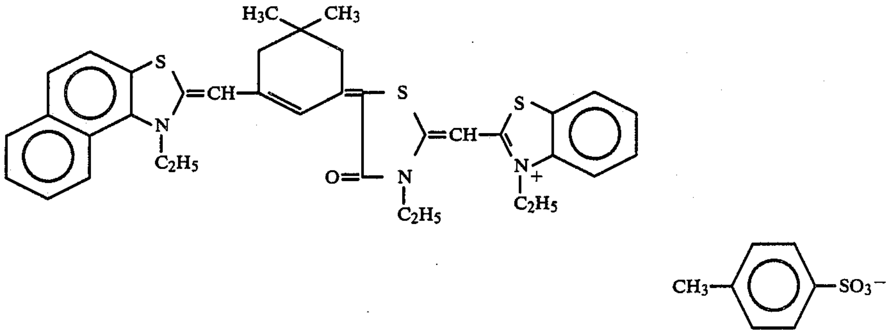
[II-7]
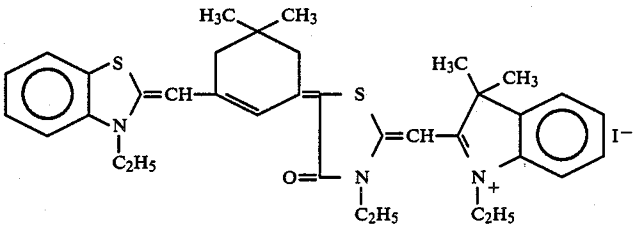
[II-8]
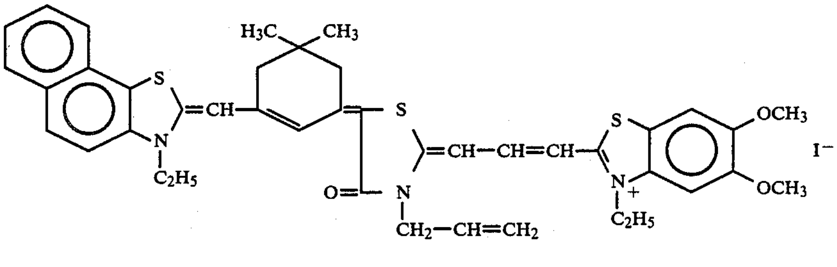
[II-9]
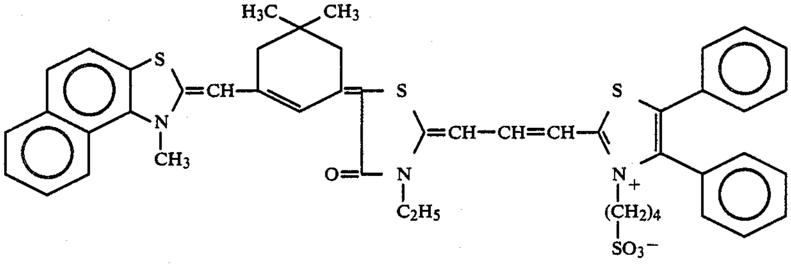
[II-10]

-continued
[II-11]
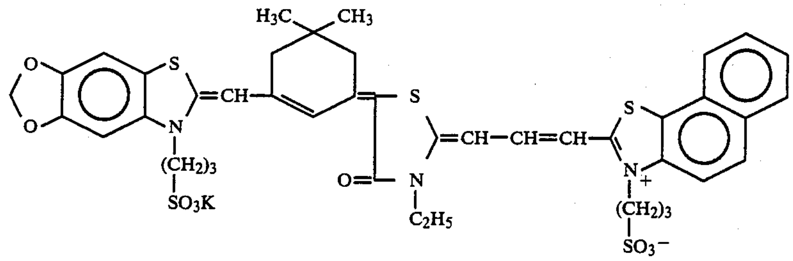
[II-12]
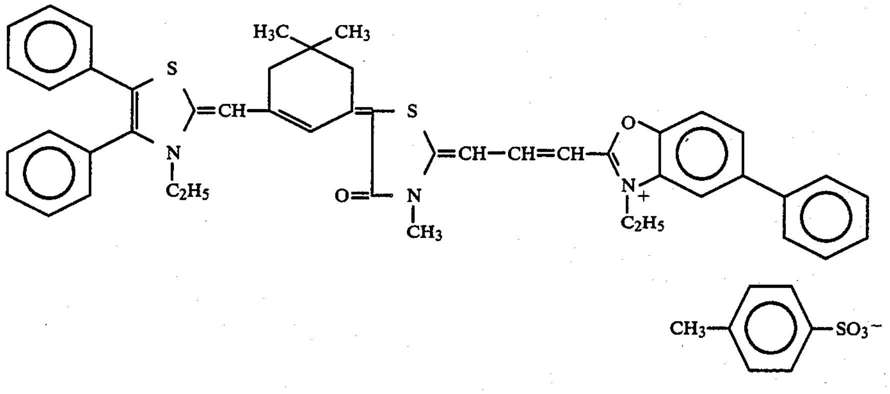
[II-13]
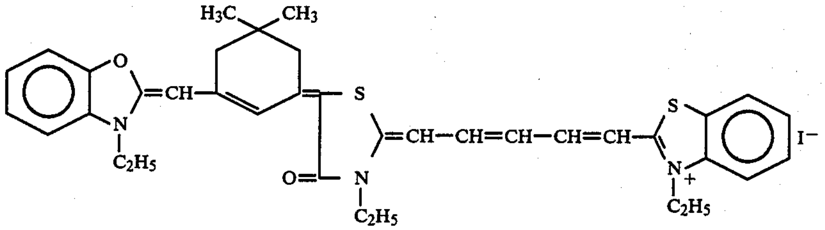
[II-14]
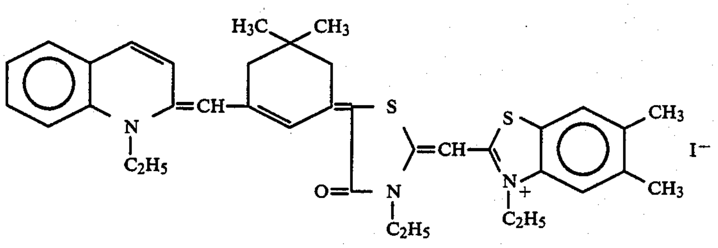
Examples of the sensitizing dyes represented by the general formula (III).
[III-1]
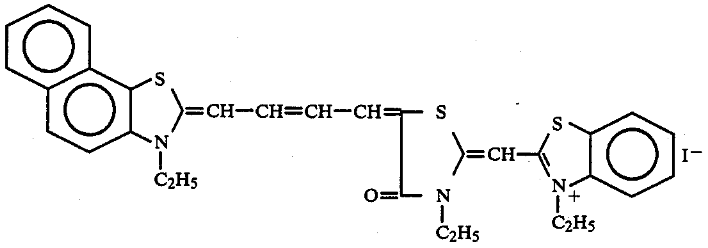

-continued
[III-2]
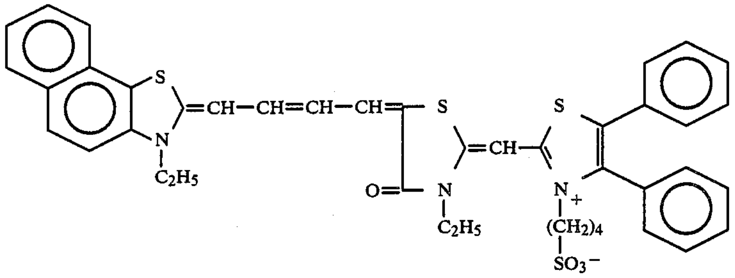
[III-3]
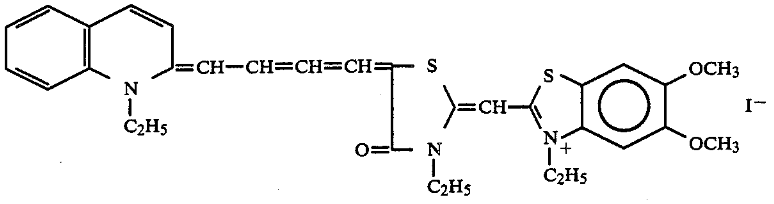
[III-4]
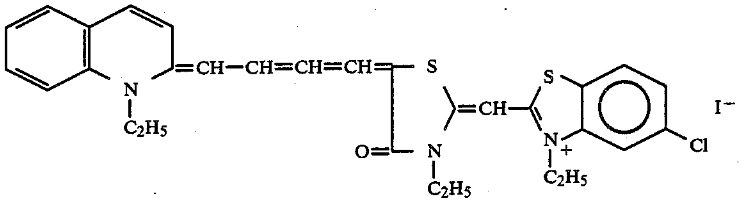
[III-5]
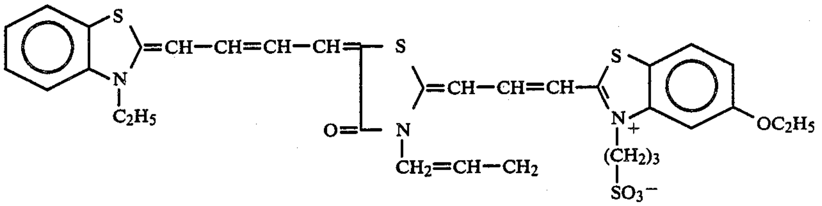
[III-6]
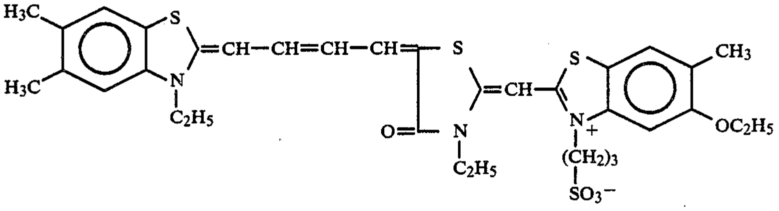
[III-7]
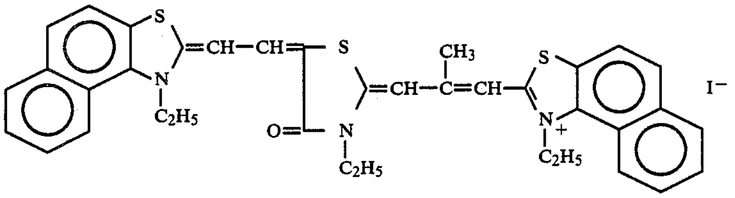
[III-8]
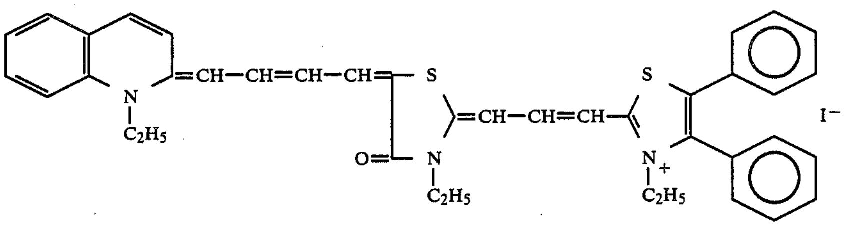

-continued
[III-9]
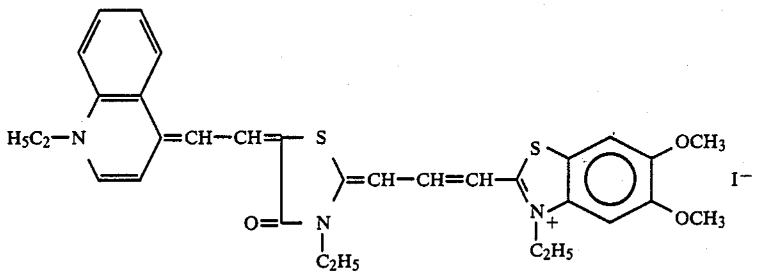
[III-10]
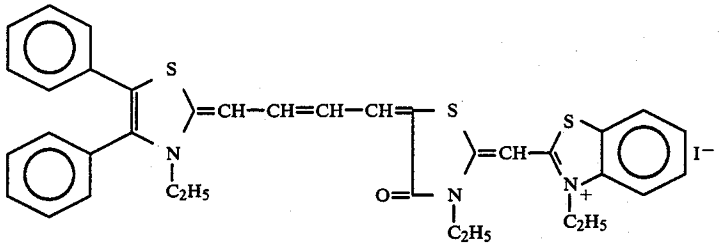
[III-11]
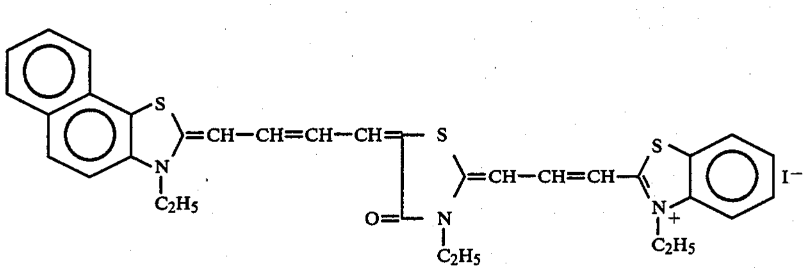
Examples of the sensitizing dyes represented by the general formula (IV)
[IV-1]
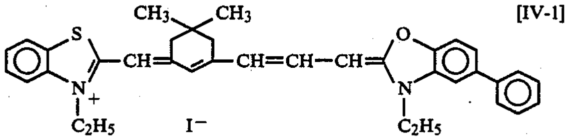
[IV-2]
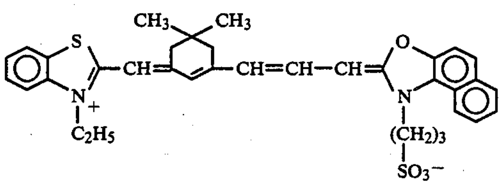
[IV-3]
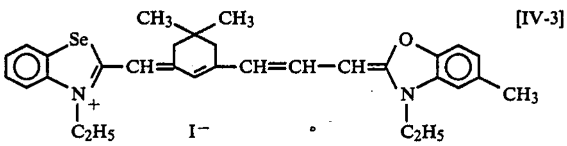
[IV-4]
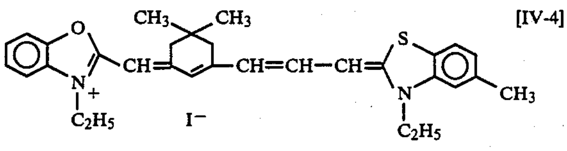
-continued
[IV-5]
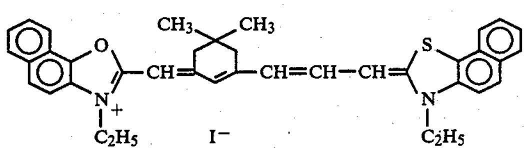
[IV-6]
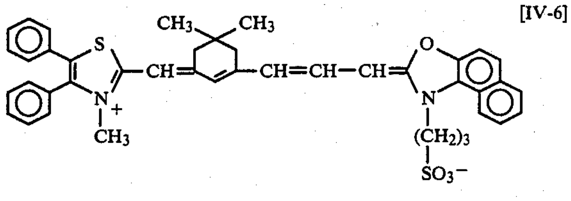
[IV-7]
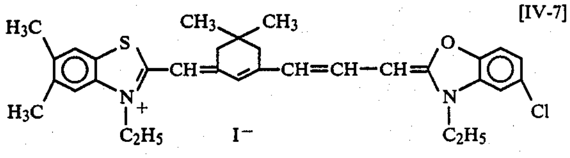
[IV-8]
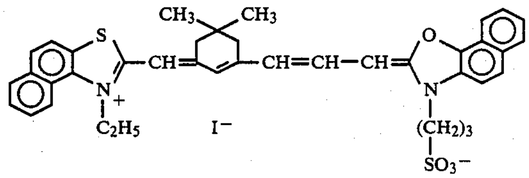

-continued
[IV-9]
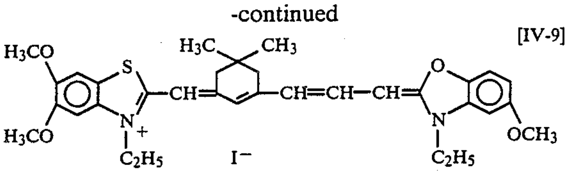
Examples of the sensitizing dyes represented by the general formula (V).
[V-1]
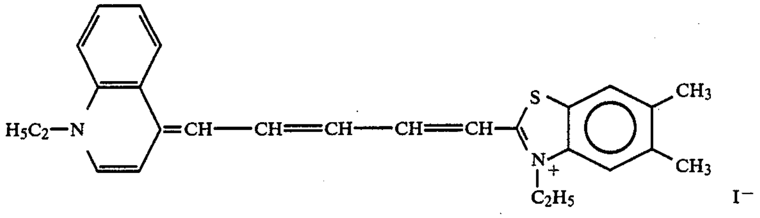
[V-2]
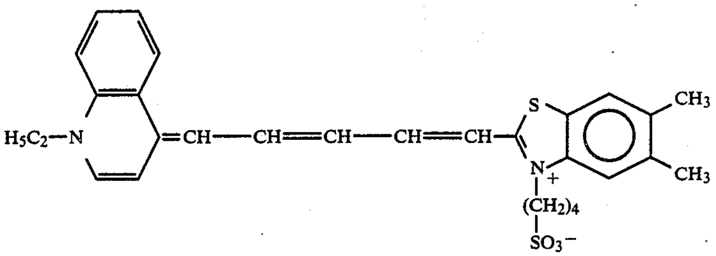
[V-3]
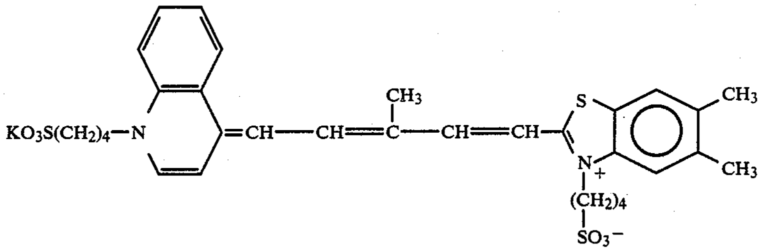
[V-4]
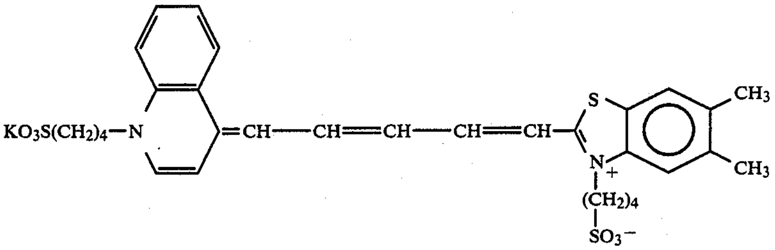
[V-5]
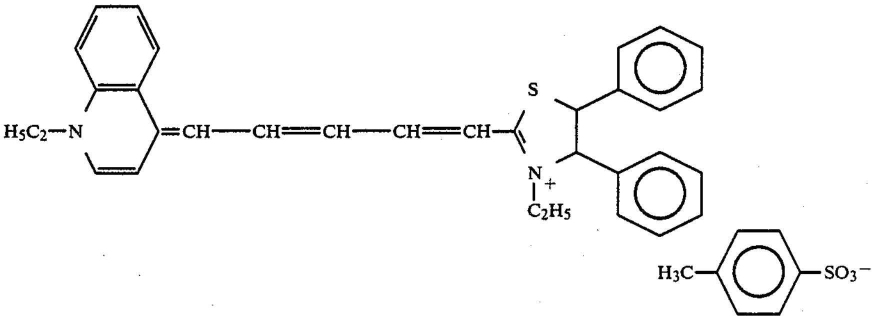

-continued
[V-6]
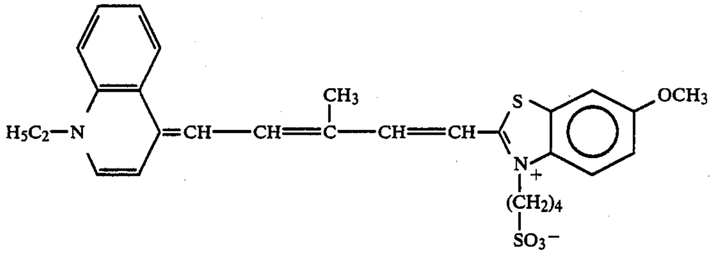
[V-7]
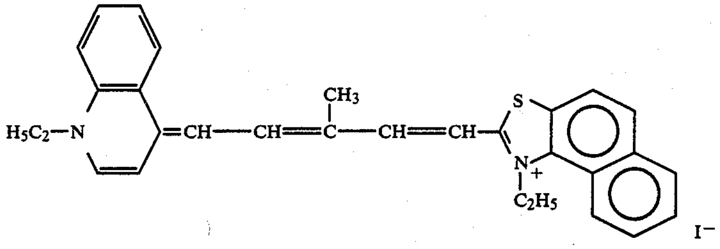
[V-8]
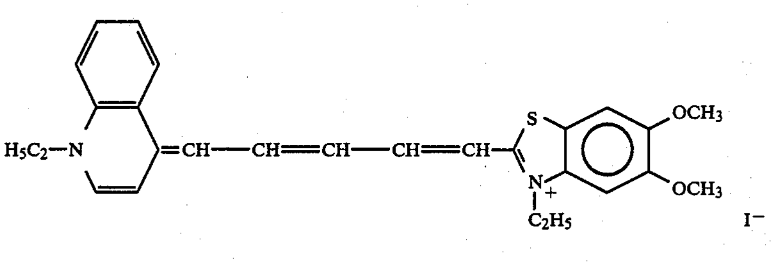
[V-9]
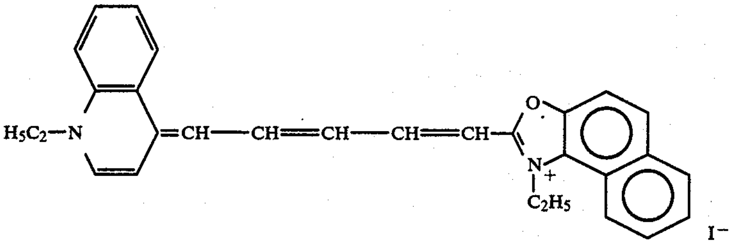
[V-10]
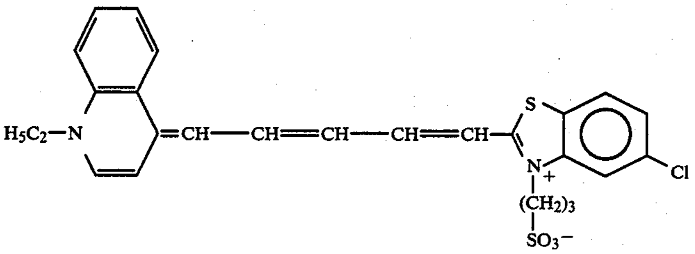
[V-11]
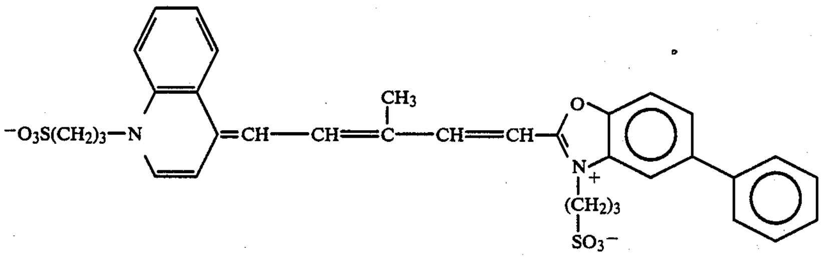

-continued

[V-12]

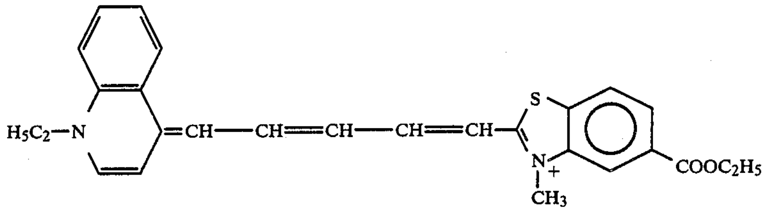

This invention also includes photographic light sensitive materials having a silver halide emulsion layer which contains a novel rhodacyanine dye represented by the following general formula (VI).

General Formula (VI)

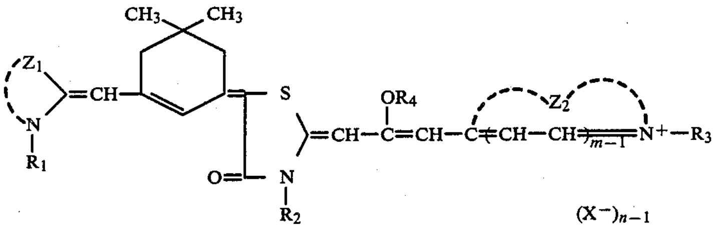

wherein $Z_1$ represents a group of atoms necessary for forming a thiazole ring, benzothiazole ring or naphthothiazole ring; $Z_2$ represents a group of atoms necessary for forming a 5- or 6-membered nitrogen containing heterocyclic ring; $R_1$, $R_3$ and $R_4$ represent alkyl group, aralkyl group or alkenyl group; $R_2$ represents an alkyl group, an aralkyl group, an alkenyl group or an aryl group; X represents an acid anion; and m and n represent 1 or 2.

Examples of these dyes are shown as examples of the dyes represented by the general formula (I).

Typical example of synthesis of the novel rhodacyanine dye used in this invention is shown below.

Synthesis of dye [I-10]:

2.21 g of 3-ethyl-5-[3-(3-ethylbenzothiazoline-2-ylidene)methyl-5,5-dimethyl-2-cyclohexene-1-ylidene]rhodanine (disclosed in U.S. Pat. No. 2,856,404) was mixed with 3.15 g of dimethylsulfuric acid and the mixture was heated to a bath temperature of 90°-100° C. for 15 minutes. After cooling, the reaction product was washed with ethyl ether, followed by adding 2.16 g of 2-(2-ethoxy-1-propenyl)-3-ethyl-5,6-dimethylbenzoxazolium-p-toluene-sulfonate and 30 ml of ethanol and heating to obtain a homogeneous solution. Then, 3.0 ml of triethylamine was added to the solution, which was then subjected to reflux for 30 minutes with heating. After termination of the reaction, ethyl acetate was added thereto and the precipitate was filtered off and washed with ethyl acetate. The resulting crude dye was recrystallized twice with ethanol and dried to give 1.00 g of dark yellowish green crystalline powder having a melting point of 197.0° C. (dec.). Absorption maximum of methanolic solution of the dye was 689 nm.

Other dyes used in this invention may also be readily synthesized in accordance with the above process.

The sensitizing dye can be added to the silver halide emulsion at any time before coating. The addition amount of the dye may be varied in a wide range, but good results can be obtained when it is added in an amount of $1\times10^{-5}$–$1\times10^{-2}$ mole for 1 mole of silver halide, the optimum amount being dependent upon the type of silver halide such as halogen composition, average grain size, crystal habit, etc.

The silver halide emulsion used in the lithographic printing plate of this invention may be silver chloride, silver bromide, silver chlorobromide, silver chloroiodide, silver chlorobromoiodide, etc. and preferably a silver halide comprising at least 50 mole % of silver chloride. The average grain size of these silver halides is preferably in the range of 0.2–0.8μ, though other grain size are usable. The emulsion is preferably monodispersed emulsion, 90% or more of total grains having a size within ±30% of the average size. The grains are preferably in the form of substantially cube or fourteen-faced polyhedron, though those having other crystal habits are not objectionable.

The binder used in the silver halide emulsion of the lithographic printing plate of this invention is usually gelatin which can be partially replaced with one or more hydrophilic polymer binders such as starch, albumin, sodium alginate, hydroxyethylcellulose, gum arabic, polyvinyl alcohol, carboxymethylcellulose, polyvinyl pyrrolidone, polyacrylamide, styrene-maleic anhydride copolymer, polyvinyl methyl ether-maleic anhydride copolymer, etc. It is further possible to use an aqueous dispersion (latex) of vinyl polymers.

The silver halide emulsion can be sensitized in various ways during its preparation or coating. The emulsion is preferably sensitized chemically by the methods well known to the art by using, for example, sodium thiosulfate, alkylthioureas, or gold compounds such as gold rhodanide and gold chloride or mixtures thereof.

Those characteristics such as high sensitivity, high sharpness and high resolving power which are desirable for the direct processing printing plates may be imparted by adding, at any time during the emulsion preparation, compounds of metals of Group VIII of the periodic table, such as, for example, salts of cobalt, nickel, rhodium, palladium, iridium and platinum. The amount of addition is in the range of $10^{-8}$–$10^{-3}$ mole for 1 mole of silver halide. The silver halide emulsion layer may contain other additives such as coating aids, hardeners, antifoggants, matting agents (water-holding agents), and developing agents which are customarily used.

Higher sensitivity and printing endurance can be obtained by using the compounds represented by the following general formulas (A) and/or (B) in combination with the above mentioned near infrared sensitizing dyes in silver halide emulsion layer used in this invention.

General formula (A)

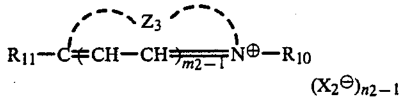

General formula (B)

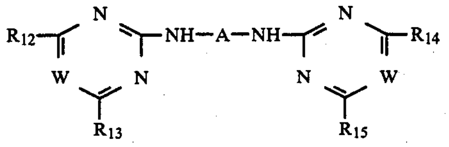

In the general formula (A), $Z_3$ represents a group of atoms necessary for forming the 5- or 6-membered nitrogen containing heterocyclic ring as mentioned for $Z_1$ and $Z_2$ of the general formula (I); $R_{11}$ represents hydrogen atom or alkyl or aryl group as mentioned in the general formula (I); $R_{10}$ represents an alkyl or alkenyl group as mentioned in the general formula (I); $X_2^-$ represents an acid anion as mentioned for X of the general formula (I) with a proviso that if the compound has a betaine analogous structure, $X_2^-$ is not present; and $m_2$ and $n_2$ represent integers of 1 or 2.

Typical examples of the compounds represented by the general formula (A) are shown below.

[A-1]

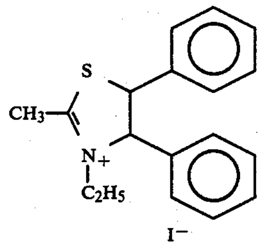

[A-2]

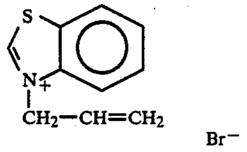

[A-3]

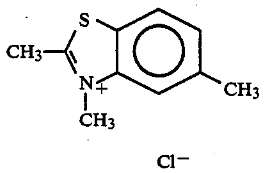

[A-4]

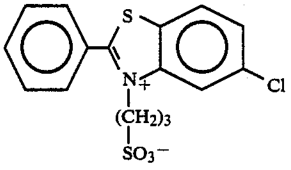

-continued

[A-5]

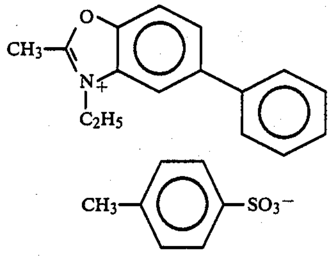

[A-6]

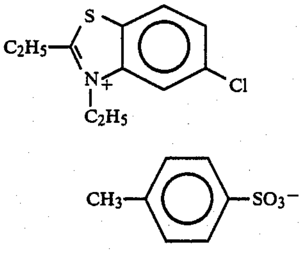

[A-7]

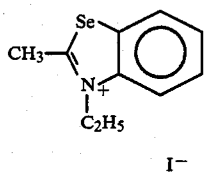

[A-8]

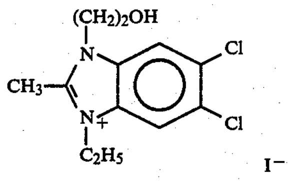

[A-9]

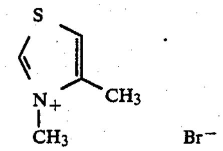

[A-10]

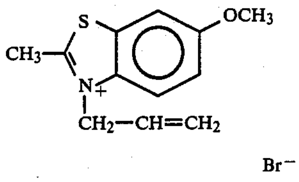

[A-11]

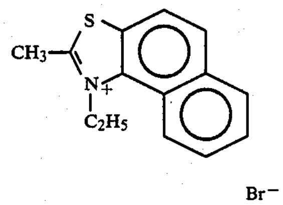

[A-12]

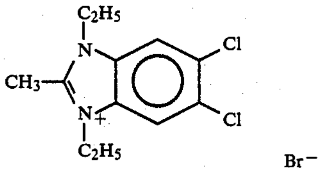

In the general formula (B), A represents a divalent aromatic residue which may contain —$SO_3M$ group (M represents hydrogen atom or a cation such as sodium, potassium, etc.) with a proviso that when $R_{12}$–$R_{15}$ do not contain —$SO_3M$ group, A contains —$SO_3M$ group; $R_{12}$–$R_{15}$ represent hydrogen atom, hydroxy group, aryloxy group (e.g., phenoxy, naphthoxy, o-toloxy, p-sulfophenoxy, etc.), heterocyclic ring (e.g., morpholinyl, piperidyl, etc.), alkylthio group (e.g., methylthio, ethylthio, etc.), heterocyclicthio group (e.g., benzothiazolylthio, benzoimidazolylthio, etc.), arylthio group (e.g., phenylthio, tolylthio, etc.), amino group, alkylamino group, (e.g., methylamino, ethylamino, diethylamino, β-hydroxyethylamino, β-sulfoethylamino, etc.), arylamino group (e.g., anilino, o-, m- or p-sulfoanilino, o-, m- or p-toluidino, o-, m- or p-carboxyanilino, o-, m- or p-chloroanilino, o-, m- or p-anisidino, o-acetaminoanilino, hydroxyanilino, naphthylamino, sulfonaphthylamino, etc.). heterocyclicamino group (e.g., 2-benzothiazolylamino, 2-piridylamino, etc.), aralkylamino group (e.g., benzylamino, o-, m- or p-anisylamino, etc.), mercapto group, or halogen atom, alkyl group or alkoxy group as mentioned for $R_4$–$R_9$ of the general formula (I); W represents —CH= or —N=, preferably —CH=, and examples of A are as follows:

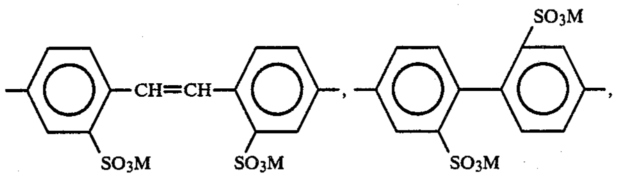

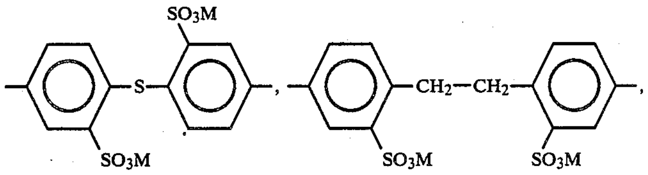

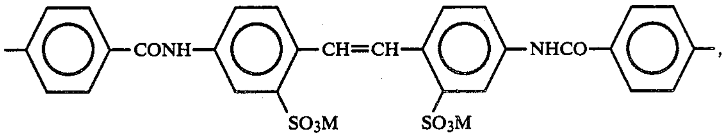

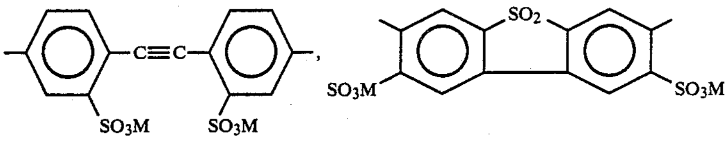

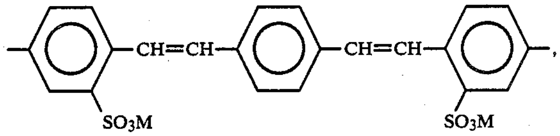

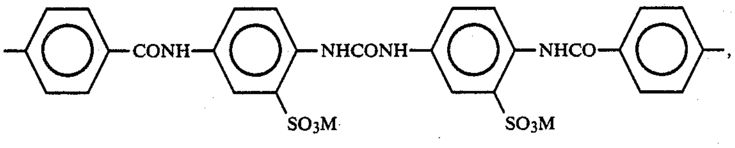

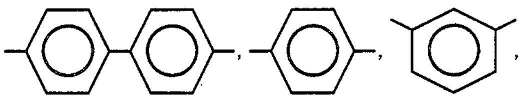

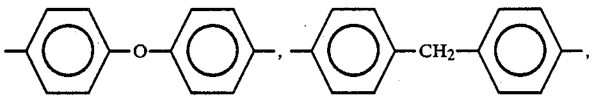

-continued

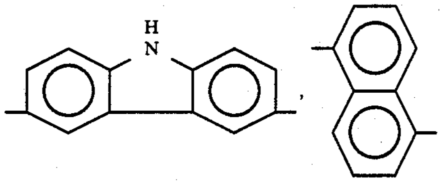

Typical examples of the compounds represented by the general formula (B) are shown below.

(B-1) Disodium 4,4'-bis[4,6-di(benzothiazolyl-2-thio)-pyrimidine-2-ylamino]stilbene-2,2'-disulfonate (B-2) Disodium 4,4'-bis[4,6-di(benzothiazolyl-2-amino)-pyrimidine-2-ylamino]stilbene-2,2'-disulfonate (B-3) Disodium 4,4'-bis[4,6-di(naphthyl-2-oxy)pyrimidine-2-ylamino]stilbene-2,2'-disulfonate (B-4) Disodium 4,4'-bis[4,6-di(naphthyl-2-oxy)pyrimidine-2-ylamino]dibenzyl-2,2'-disulfonate (B-5) Disodium 4,4'-bis(4,6-dianilinopyrimidine-2-ylamino)stilbene-2,2'-disulfonate (B-6) Disodium 4,4'-bis[4-chloro-6-(2-naphthyloxy)-pyrimidine-2-ylamino]biphenyl-2,2'-disulfonate (B-7) Disodium 4,4'-bis[4,6-di(1-phenyltetrazolyl-5-thio)pyrimidine-2-ylamino]stilbene-2,2'-disulfonate (B-8) Disodium 4,4'-bis[4,6-di(benzoimidazolyl-2-thio)-pyrimidine-2-ylamino]stilbene-2,2'-disulfonate (B-9) Disodium 4,4'-bis(4,6-diphenoxypyrimidine-2-ylamino)stilbene-2,2'-disulfonate (B-10) Disodium 4,4'-bis(4,6-diphenylthiopyrimidine-2-ylamino)stilbene-2,2'-disulfonate (B-11) Disodium 4,4'-bis(4,6-dimercaptopyrimidine-2-ylamino)biphenyl-2,2'-disulfonate (B-12) Disodium 4,4'-bis(4,6-dianilino-triazine-2-ylamino)stilbene-2,2'-dislufonate (B-13) Disodium 4,4'-bis(4-anilino-6-hydroxy-triazine-2-ylamino)stilbene-2,2'-disulfonate (B-14) Disodium 4,4'-bis(4-naphthylamino-6-anilinotriazine-2-ylamino)stilbene-2,2'-disulfonate Either one of the compound represented by the general formula (A) or the compound represented by the general formula (B) may be added, but two or more of the compounds represented by the general formula (A) or two or more of the compounds represented by the general formula (B) may be added or at least one of the compound represented by the general formula (A) and at least one of the compound represented by the general formula (B) may be added in combination.

Which compound is more effective for the sensitizing dye represented by the general formulas (I)–(V), the compound represented by the general formula (A) or (B), depends on the kinds of the sensitizing dyes and the compounds and combinations thereof. In general, addition of the compound represented by the general formula (A) and the compound represented by the general formula (B) in combination is more advantageous.

Addition amount of the compounds represented by the general formulas (A) and (B) is $1\times10^{-4}$–$3\times10^{-1}$ mole, preferably $5\times10^{-4}$–$2\times10^{-1}$ more per 1 mole of silver halide, respectively.

A subbing layer for improving adhesion or an undercoat layer which may contain a coloring agent such as carbon black and a compound absorbing a light of at least 700 mμ may be provided below the silver halide emulsion layer (and above the support). This undercoat layer may further contain a developing agent or a matting agent.

An image receiving layer is provided above the silver halide emulsion layer, namely, as an outermost surface layer. The image receiving layer contains known physical development nuclei such as metals including antimony, bismuth, cadmium, cobalt, palladium, nickel, silver, lead, zinc, etc. and sulfides thereof, etc. The image receiving layer may contain at least one hydrophilic colloid such as gelatin, carboxymethylcellulose, gum arabic, sodium alginate, hydroxyethyl starch, dialdehyde starch, dextrin, hydroxyethylcellulose, polystyrenesulfonic acid, a vinylimidazole-acrylamide copolymer, polyvinyl alcohol, etc. This hydrophilic colloid contained in the image receiving layer is preferably 0.1 $g/m^2$ or less. The image receiving layer may further contain hygroscopic substances or wetting agents such as sorbitol, glycerol, etc. It may further contain anti-scumming pigments such as barium sulfate, titanium dioxide, China clay, silver, etc., developing agents such as hydroquinone and hardeners such as formaldehyde, dichloro-S-triazine, etc.

The supports may be paper, films such as cellulose acetate film, polyvinyl acetal film, polystyrene film, polypropylene film, polyethylene terephthalate film, etc., composite films such as polyester, polypropylene, or polystyrene films coated with polyethylene film; metals; metallized paper; or metal/paper laminates. A paper support coated on one or both sides with an olefin polymer such as polyethylene is also useful. These supports may contain compounds having antihalation power.

The processing solution for development used in this invention may contain alkaline substances such as sodium hydroxide, potassium hydroxide, lithium hydroxide, sodium tertiary phosphate, etc.; preservatives such as sulfites, etc.; silver halide solvents such as thiosulfates, cyclic imides, thiosalicyclic acid, amines, etc.; thickening agents such as hydroxyethylcellulose, carboxymethylcellulose, etc.; antifoggants such as potassium bromide, 1-phenyl-5-mercaptotetrazole, compounds described in Japanese Patent Unexamined Publication (Kokai) No. 26201/72, etc.; developing agents such as hydroquinone, 1-phenyl-3-pyrazolidone, etc.; development modifiers such as polyoxyalkylene compounds, onium compounds, etc.

When the silver complex diffusion transfer process is carried out, the developing agent may be contained in the silver halide emulsion layer and/or the image receiving layer or other water permeable layers contiguous to the image receiving layer as described in British Pat. Nos. 1,000,115, 1,012,476, 1,017,273, and 1,042,477. Therefore, in such case, use may be made of a so-called "alkaline activating solution" containing no developing agent.

The lithographic printing plates made in accordance with this invention can be rendered ink receptive or enhanced in ink receptivity by use of such compounds as described in Japanese Patent Examined Publication (Kokoku) No. 29723/73 and U.S. Pat. No. 3,721,539.

The printing method, etch solution and damping solution are those which are known to the art.

The following nonlimiting examples further illustrate this invention.

EXAMPLE 1

On one side of a subbed polyester film support, was provided a matting layer containing powdered silica of 5μ in average particle size. On another side, was provided an undercoat layer (adjusted to pH 4) containing carbon black and 20% by weight based on the photographic gelatin of powdered silica, 7μ in average particle size. On this undercoat layer was provided a high speed silver chloroiodobromide emulsion layer (Br: 3 mol %, I: 0.4 mole % and Cl: 96.6 mole % and adjusted to pH 4.0) containing 5% by weight (based on photographic gelatin) of powdered silica, 7μ in average particle size, which had been chemically sensitized with a gold compound and then spectrally sensitized.

The application rate of gelatin in the undercoat layer was 3.0 g/m$^2$, that of gelatin in the emulsion layer was 1.0 g/m$^2$ and that of silver halide in terms of silver nitrate was 1.0 g/m$^2$. These undercoat layer and emulsion layer contained 5.0 mg of formaldehyde as a hardener for 1 g of gelatin. After drying, the coated support was heated at 40° C. for 14 days. Then, the emulsion layer was overcoated with a nuclei coating composition described in Japanese Patent Unexamined Publication (Kokai) No. 21602/78 (the polymer used was No. 3 acrylamide-imidazole copolymer and hydroquinone was contained in an amount of 0.8 g/m$^2$) and was dried to obtain a light sensitive material for lithographic printing plate. The above mentioned silver halide emulsion contained $5\times10^{-6}$ mole of rhodium chloride for 1 mole of silver halide which had been added during physical ripening of the emulsion. The silver halide grains were in substantially cubic form and were 0.3μ in average grain size and 90% or more of the total grains were distributed within ±30% of the average grain size.

Eleven light sensitive materials for lithographic printing plates were prepared in the same manner as above except that $10^{-3}$ mole (for 1 mole of silver halide) of each sensitizing dye shown in Table 1 was added to each silver halide emulsion.

The following dyes were used as comparative dyes.

[A]

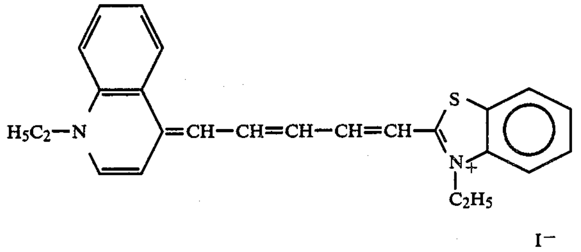

[B]

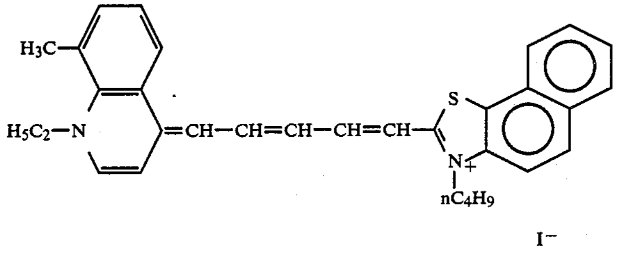

[C]

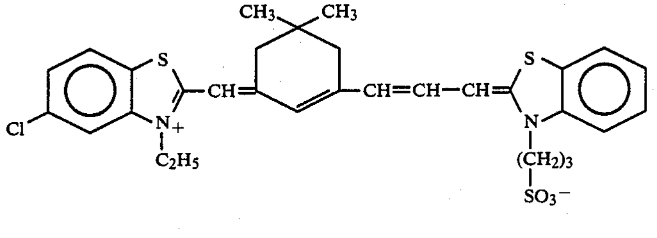

[D]

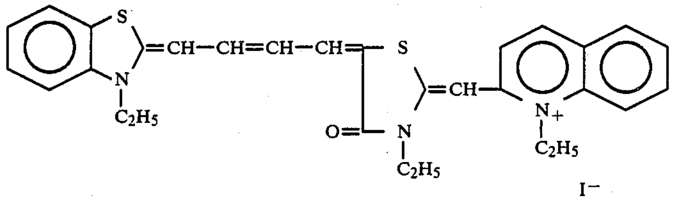

-continued

[E]

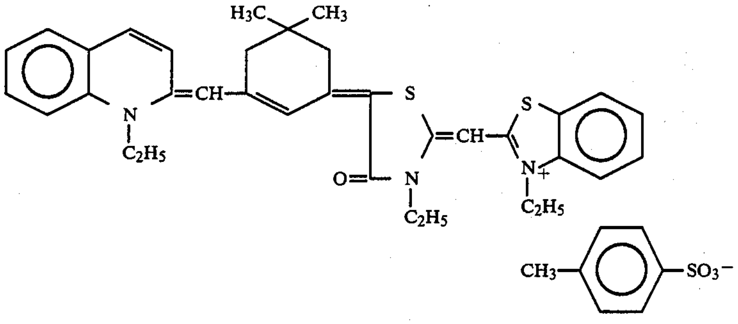

[F]

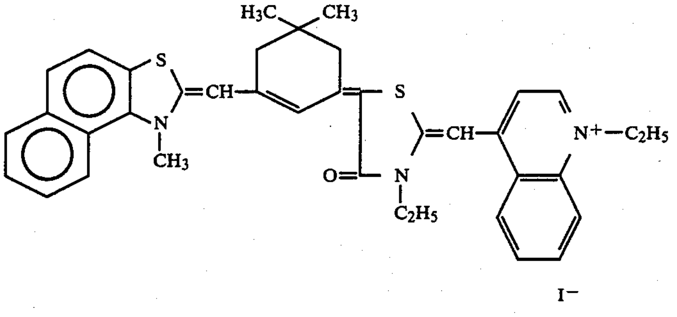

[G]

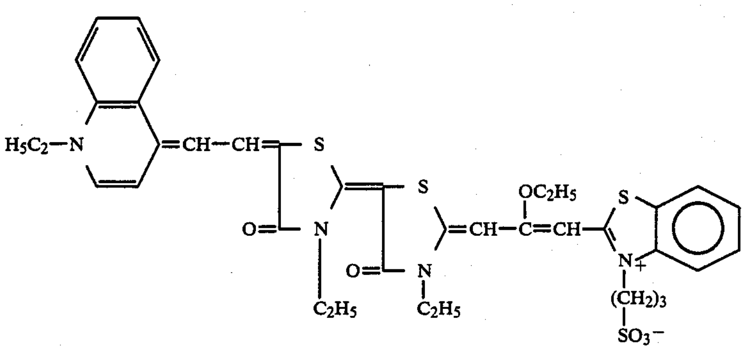

Each of these light sensitive materials in close contact with an original of a film block copy containing thin line images was exposed to a light source to which was attached a dark red filter SC-70 (manufactured by Fuji Photo Film Co., Ltd.) which transmitted light having wavelengths longer than about 700 mμ. The exposure was carried out by subjecting the material to a flash exposure for a period in the range of $10^{-4}$–$10^{-5}$ seconds depending on sensitivity difference so that nearly the same print exposures were attained. These were used as samples for printing test.

Separately the light sensitive materials were subjected to a flash exposure for $10^{-5}$ seconds through an optical wedge to a light source to which the dark red filter SC-70 was attached. These were used as samples for sensitometry.

After the exposure, the light sensitive materials were developed with the following diffusion transfer developer.

| Developer | | |
|---|---|---|
| Water | 700 | ml |
| Sodium hydroxide | 18 | g |
| Potassium hydroxide | 7 | g |
| Anhydrous sodium sulfate | 50 | g |
| 2-Mercaptobenzoic acid | 1.5 | g |
| 2-Methylamino ethanol | 15 | g |

-continued

| Developer |
|---|
| Water to make up 1 l |

After the development treatment, these materials were passed between two squeeze rollers to remove excess developer, immediately thereafter treated with the following neutralizing solution at 25° C. for 20 seconds, passed between squeeze rollers to remove excess solution and dried at room temperature.

| Neutralizing solution | | |
|---|---|---|
| Water | 600 | ml |
| Citric acid | 10 | g |
| Sodium citrate | 35 | g |
| Colloidal silica (20% solution) | 5 | ml |
| Ethylene glycol | 5 | ml |
| Water was added to make up 1 l. | | |

Sensitivity of this light sensitive materials and printing endurance of the resulting lithographic printing plates are shown in Table 1. The sensitivity was evaluated by the exposure required before the precipitation of the transferred silver had no more been observed and expressed as a relative value by assuming the sensitivity in the case of the sensitizing dye (I-5) to be 1.0 as standard. The printing endurance was evaluated in terms of the number of copies delivered before the printing had become impossible owing to the occurrence of scumming or partial disappearance of silver image and expressed in grade number rated in accordance with the following criteria.

| Grade No. | Number of copies |
|---|---|
| 1 | <4000 |
| 2 | 4000–6000 |
| 3 | 6000–8000 |
| 4 | 8000–10000 |
| 5 | >10000 |

The printing for the above tests was carried out by mounting a sheet to which each of the samples was applied, on an offset printing machine, applying the following etch solution to allover the plate surface and using the following damping solution. The printing machine was A. B. Dick 350 CD (Trademark for offset printing machine supplied by A. B. Dick Co.).

| Etch solution | |
|---|---|
| Water | 600 ml |
| Isopropyl alcohol | 400 ml |
| Ethylene glycol | 50 ml |
| 3-mercapto-4-acetamido-5-n-heptyl-1,2,4-triazole | 1 g |
| **Damping solution** | |
| o-Phosphoric acid | 10 g |
| Nickel nitrate | 5 g |
| Sodium sulfate | 5 g |
| Ethylene glycol | 100 g |
| Colloidal silica (20% solution) | 28 g |
| Water was added to make up 2 l. | |

TABLE 1

| Sensitizing dyes | Relative sensitivity | Printing endurance |
|---|---|---|
| (I-1) | 1.2 | 4 |
| (I-5) | 1.0 | 4 |
| (I-10) | 1.3 | 3 |
| (I-16) | 1.2 | 4 |
| A | 0.4 | 2 |
| B | 0.5 | 2 |
| C | 0.2 | 1 |
| D | 0.1 | 3 |
| E | 0.2 | 2 |
| F | 0.6 | 1 |
| G | 0.2 | 4 |

EXAMPLE 2

Light sensitive materials were prepared in the same manner as in Example 1 except that a silver chloroiodide containing 0.2 mole % of silver iodide was used as the silver halide emulsion and dyes shown in Table 2 were used as the sensitizing dyes. Then, in the same manner as in Example 1, lithographic printing plates were made therefrom and printing was carried out to obtain the results as shown in Table 2. the sensitivity was expressed as a relative value by assuming the sensitivity in the case of sensitizing dye (I-3) to be 1.0 as standard.

TABLE 2

| Sensitizing dyes | Relative sensitivity | Printing endurance |
|---|---|---|
| (I-3) | 1.0 | 4 |
| (I-7) | 0.9 | 5 |
| (I-8) | 0.9 | 5 |
| (I-12) | 0.7 | 5 |
| (I-18) | 1.1 | 4 |

EXAMPLE 3

Each of the samples obtained in Examples 1 and 2 was kept at 50° C. and 80% RH for 3 days and subjected to the same tests as those of Example 1. The comparative samples had substantially no sensitivity to the radiation of about 780 mμ due to further conspicuous desensitization while the samples of this invention underwent at most about 10% of desensitization and were satisfactorily high in shelf stability.

EXAMPLE 4

Twelve light sensitive materials and lithographic printing plates were prepared in the same manner as in Example 1 except that the dyes shown in Table 3 were used in an amount of $5\times10^{-4}$ mole for 1 mole of silver halide as sensitizing dyes used in the silver halide emulsion and they were subjected to the same tests as in Example 1 except that dye (II-7) was employed as standard for evaluation of sensitivity. The results are shown in Table 3.

TABLE 3

| Sensitizing dyes | Relative sensitivity | Printing endurance |
|---|---|---|
| (II-2) | 0.8 | 4 |
| (II-3) | 0.9 | 4 |
| (II-4) | 0.9 | 4 |
| (II-5) | 0.8 | 4 |
| (II-7) | 1.0 | 4 |
| A | 0.6 | 2 |
| B | 0.7 | 2 |
| C | 0.3 | 1 |
| D | 0.2 | 3 |
| E | 0.3 | 2 |
| F | 0.9 | 1 |
| G | 0.3 | 4 |

EXAMPLE 5

Light sensitive materials were prepared in the same manner as in Example 1 except that a silver chloride emulsion containing 0.2 mole % of silver iodide was used as the silver halide emulsion and that dyes as shown in the following Table 4 were used as the sensitizing dyes. Then, in the same manner as in Example 1, lithographic printing plates were made therefrom. These samples were subjected to the same tests as in Example 1 except that the sensitivity was evaluated using the sensitizing dye (II-1) as standard. The results are shown in Table 4.

TABLE 4

| Sensitizing dyes | Relative sensitivity | Printing endurance |
|---|---|---|
| (II-1) | 1.0 | 4 |
| (II-10) | 1.2 | 5 |
| (II-11) | 0.9 | 5 |

EXAMPLE 6

The samples obtained in Examples 4 and 5 were kept at 50° C. and 80% RH for 3 days and thereafter were subjected to the same tests as in Example 1 to find that the comparative samples had substantially no sensitivity to the light of about 780 mμ owing to further conspicuous desensitization while the samples of this invention underwent desensitization of at most about 10% and were sufficiently high in shelf stability.

EXAMPLE 7

Example 1 was repeated except that dyes shown in the following Table 5 were used as the sensitizing dyes. The following dye (H) was also used as a comparative dye.

(H)

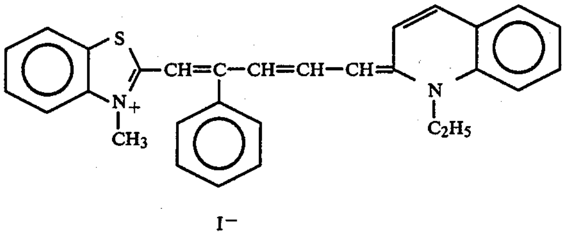

TABLE 5

| Sensitizing dyes | Relative sensitivity | Printing endurance |
|---|---|---|
| [III-3] | 1.0 | 3 |
| [III-5] | 1.2 | 4 |
| [III-9] | 1.1 | 4 |
| [III-10] | 1.1 | 4 |
| A | 0.7 | 2 |
| B | 0.8 | 2 |
| C | 0.3 | 1 |
| D | 0.2 | 3 |
| E | 0.3 | 2 |
| F | 1.0 | 1 |

TABLE 5-continued

| Sensitizing dyes | Relative sensitivity | Printing endurance |
|---|---|---|
| G | 0.3 | 4 |
| H | 0.9 | 1 |

EXAMPLE 8

Light sensitive materials were prepared in the same manner as in Example 1 except that a silver chloroiodide emulsion containing 0.2 mole % of silver iodide was used as the silver halide emulsion and the sensitizing dyes shown in the following Table 6 were used. In the same manner as in Example 1, lithographic printing plates were made therefrom. These samples were subjected to the same tests as in Example 1 with using the sensitizing dye (III-2) as standard for evaluation of sensitivity. The results are shown in Table 6.

TABLE 6

| Sensitizing dyes | Relative sensitivity | Printing endurance |
|---|---|---|
| [III-2] | 1.0 | 5 |
| [III-9] | 1.2 | 4 |
| [III-11] | 1.1 | 4 |

EXAMPLE 9

Example 1 was repeated except that dyes shown in Table 7 were used as sensitizing dyes. The following dyes (I), (J) and (K) were also used as comparative dyes.

[I]

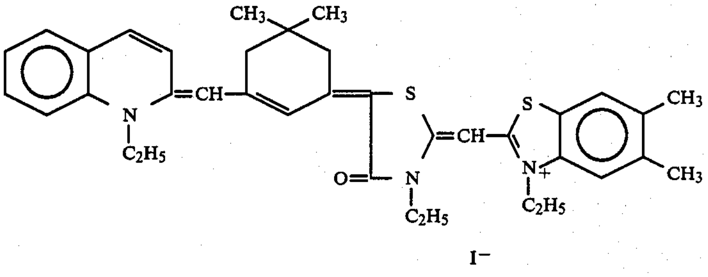

[J]

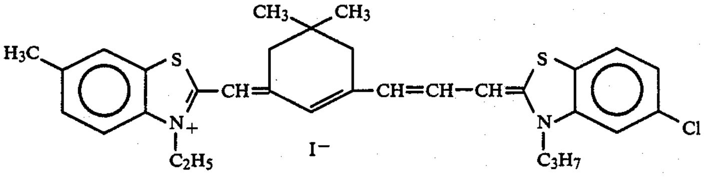

[K]

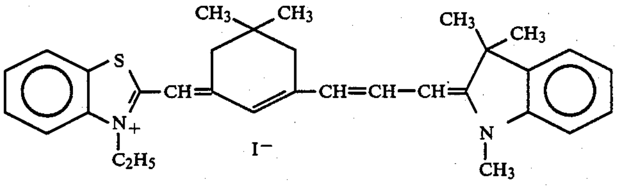

TABLE 7

| Sensitizing dyes | Relative sensitivity | Printing endurance |
|---|---|---|
| [IV-1] | 1.0 | 4 |
| [IV-4] | 1.0 | 4 |
| [IV-7] | 1.3 | 4 |
| A | 0.8 | 2 |
| B | 0.9 | 2 |

TABLE 7-continued

| Sensitizing dyes | Relative sensitivity | Printing endurance |
|---|---|---|
| C | 0.4 | 1 |
| D | 0.3 | 3 |
| E | 0.4 | 2 |
| F | 1.2 | 1 |
| G | 0.4 | 4 |
| H | 1.0 | 1 |
| I | 1.1 | 1 |
| J | 0.8 | 2 |
| K | 0.2 | 4 |

EXAMPLE 10

Light sensitive materials and lithographic printing plates were prepared in the same manner as in Example 1 except that a silver chloroiodide emulsion containing 0.2 mole % of silver iodide was used as silver halide emulsion and sensitizing dyes shown in the following Table 8 were used. These samples were subjected to the same tests as in Example 1 with using the sensitizing dye (IV-1) as standard for evaluation of sensitivity. The results are shown in Table 8.

TABLE 8

| Sensitizing dyes | Relative sensitivity | Printing endurance |
|---|---|---|
| [IV-1] | 1.0 | 4 |
| [IV-2] | 1.2 | 4 |
| [IV-9] | 1.2 | 4 |

EXAMPLE 11

Example 1 was repeated except that dyes shown in the following Table 9 were used as sensitizing dyes. The following dyes (L), (M) and (N) were also used as comparative dyes.

TABLE 9

| Sensitizing dyes | Relative sensitivity | Printing endurance |
|---|---|---|
| [V-1] | 1.0 | 4 |
| [V-2] | 1.2 | 4 |
| [V-4] | 1.3 | 4 |
| [V-6] | 1.3 | 4 |
| [V-10] | 1.2 | 4 |
| A | 0.7 | 2 |
| B | 0.7 | 2 |
| C | 0.4 | 2 |
| D | 0.2 | 3 |
| E | 0.4 | 2 |
| F | 1.1 | 2 |
| G | 0.3 | 4 |
| J | 0.8 | 2 |
| L | 0.6 | 2 |
| M | 0.5 | 3 |
| N | 0.3 | 3 |

EXAMPLE 12

Light sensitive materials and lithographic printing plates were prepared in the same manner as in Example 1 except that a silver chloroiodide emusion containing 0.3 mole % of silver iodide was used and the sensitizing dyes shown in the following Table 10 were used. The samples were subjected to the same tests as in Example 1 with using the sensitizing dye (V-1) as standard for evaluation of sensitivity.

TABLE 10

| Sensitizing dyes | Relative sensitivity | Printing endurance |
|---|---|---|
| [V-1] | 1.0 | 4 |
| [V-5] | 0.9 | 4 |
| [V-8] | 1.2 | 4 |
| [V-12] | 1.0 | 4 |

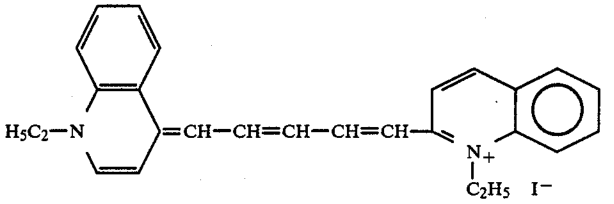

[L]

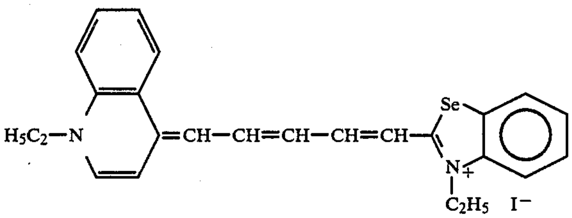

[M]

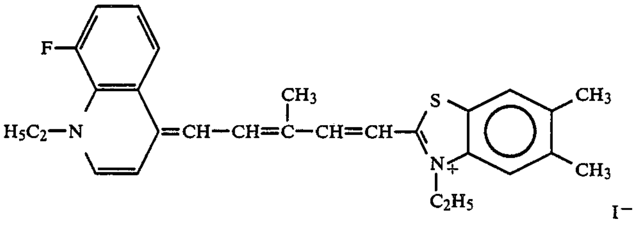

[N]

EXAMPLE 13

On one side of a subbed polyester film support, was provided a matting layer containing powdered silica of $5\mu$ in average particle size. On another side, was provided an undercoat layer (adjusted to pH 4.5) containing carbon black and 20% by weight (based on photographic gelatin) of powdered silica of $7\mu$ in average particle size. On the undercoat layer was provided a silver halide emulsion layer (adjusted to pH 4.5) containing 5% by weight (based on photographic gelatin) of powdered silica of $7\mu$ in average particle size which had been chemically sensitized with a gold compound and thiosulfate.

The silver halide emulsion comprised silver chloride crystals of substantially cubic form and contained $5\times10^{-6}$ mole of rhodium chloride for 1 mole of silver halide. The silver halide grains were $0.4\mu$ in average grain size and 90% or more of the total grains were distributed within $\pm 30\%$ of the average grain size.

The application rate of gelatin in the undercoat layer was 3.0 g/m², that of gelatin in the emulsion layer was 1.0 g/m² and that of the silver halide was 1.2 g/m² in terms of silver nitrate. Both the undercoat layer and the emulsion layer contained 5.0 mg of formaldehyde as hardener for 1 g of gelatin. After drying, the coated support was heated at 40° C. for 14 days. The emulsion layer was then coated with a nuclei coating composition of plate No. 11 in Example 1 of Japanese Patent Unexamined Publication (Kokai) No. 103104/79.

Light sensitive materials for lithographic printing plate (samples A–H) were prepared by the same procedure as mentioned above except that sensitizing dyes of the general formula (II) and the compounds of the general formulas (A) and (B) were added to the emulsion layer as shown in Table 11.

These samples immediately after the preparation (kept for a whole day and night at 35° C.) and after kept at 50° C. and 80% RH for 4 days were exposed in the following manner.

Each of the samples in close contact with an original of film block copy containing thin line images was subjected to a flash exposure to a light source having a dark red filter SC-70 (manufactured by Fuji Photo Film Co.) which transmitted the light having a wavelength longer than about 700 nm for a period in the range of $10^{-3}$–$10^{-5}$ seconds depending on the difference in sensitivity so that substantially the same print exposure was obtained. These were used as samples for printing tests.

Separately, each of the samples was subjected to a flash exposure to a light source having the dark red filter SC-70 through an optical wedge for $10^{-5}$ seconds. These were used as samples for sensitometry.

Each of the imagewise exposed samples was developed with the following diffusion transfer developer at 25° C. for 30 seconds.

After development, the sample was passed between two squeeze rollers to remove excess developer, immediately thereafter treated with the neutralizing solution used in Example 1 at 25° C. for 20 seconds, passed between squeeze rollers to remove excess solution and then dried at room temperature.

| Diffusion transfer developer | |
|---|---|
| Water | 700 ml |
| Sodium hydroxide | 18 g |
| Potassium hydroxide | 7 g |
| Anhydrous sodium sulfate | 50 g |
| Hydroquinone | 13 g |
| Phenidone | 1.5 g |
| 2-Mercaptobenzoic acid | 2 g |
| Uracil | 2 g |
| 2-Methylamino ethanol | 30 ml |
| 5-Phenyl-2-mercapto-1,3,4-oxadiazole | 0.1 g |
| | 0.1 g |
| Water was added to make up 1 l. | |

Printing endurance was evaluated in the same way as in Example 1 except that it was expressed in grade number rated in accordance with the following criteria.

| Grade No. | Number of copies |
|---|---|
| 1 | <1000 |
| 2 | 1000–3000 |
| 3 | 3000–5000 |
| 4 | 5000–7000 |
| 5 | >7000 |

The sensitivity was evaluated by the exposure required before the precipitation of the transferred silver had no more been observed and expressed as a relative value by assuming the sensitivity of Samples A and E (containing only dyes) just after preparation to be 100.

TABLE 11

| Samples | Sensitizing dyes ($\times 10^{-4}$ mole) | Compounds of formula (A) (mg) | Compounds of formula (B) (mg) |
|---|---|---|---|
| A | (II-14) 5 | | |
| B | (II-14) 5 | (A-2) 200 | |
| C | (II-14) 5 | | (B-3) 200 |
| D | (II-14) 5 | (A-2) 200 | (B-3) 200 |
| E | (I-2) 5 | | |
| F | (I-2) 5 | (A-6) 200 | |
| G | (I-2) 5 | | (B-3) 200 |
| H | (I-2) 5 | (A-6) 200 | (B-3) 200 |

The addition amount was per 1 mole of silver halide. This is the same in the following.

The results are shown in Table 12.

TABLE 12

| | Immediately after preparation | | Kept at 50° C., 80% RH for 4 days | |
|---|---|---|---|---|
| Samples | Sensitivity | Printing endurance | Sensitivity | Printing endurance |
| A | 100 (standard) | 4 | 60 | 2 |
| B | 110 | 4 | 90 | 4 |
| C | 140 | 4 | 120 | 4 |
| D | 170 | 4 | 150 | 4 |
| E | 100 (standard) | 4 | 70 | 2 |
| F | 130 | 4 | 120 | 4 |
| G | 110 | 4 | 90 | 4 |
| H | 160 | 5 | 140 | 4 |

EXAMPLE 14

Example 13 was repeated except that the dyes and the compounds were used as shown in Table 13. The results are shown in Table 14.

TABLE 13

| Samples | Sensitizing dyes ($\times 10^{-4}$ mole) | Compounds of formula (A) (mg) | Compounds of formula (B) (mg) |
|---|---|---|---|
| A | (IV-4) 5 | | |
| B | (IV-4) 5 | (A-2) 200 | |
| C | (IV-4) 5 | | (B-3) 200 |
| D | (IV-4) 5 | (A-2) 200 | (B-3) 200 |
| E | (V-2) 5 | | |
| F | (V-2) 5 | (A-6) 200 | |
| G | (V-2) 5 | | (B-3) 200 |
| H | (V-2) 5 | (A-6) 200 | (B-3) 200 |

TABLE 14

| | Immediately after preparation | | Kept for 3 days | |
|---|---|---|---|---|
| Samples | Sensitivity | Printing endurance | Sensitivity | Printing endurance |
| A | 100 (standard) | 3 | 70 | 2 |
| B | 190 | 4 | 200 | 4 |
| C | 220 | 4 | 240 | 4 |
| D | 360 | 4 | 390 | 4 |
| E | 100 (standard) | 3 | 40 | 1 |
| F | 160 | 4 | 140 | 3 |
| G | 110 | 4 | 90 | 4 |
| H | 140 | 4 | 130 | 4 |

What is claimed is:

1. A light sensitive material for lithographic printing plate which comprises a support and at least a silver halide emulsion layer and a surface physical development nuclei layer provided on said support wherein said silver halide emulsion layer contains at least one of the sensitizing dyes represented by the following general formulas (I), (II), (III), (IV) and (V):

General formula (I)

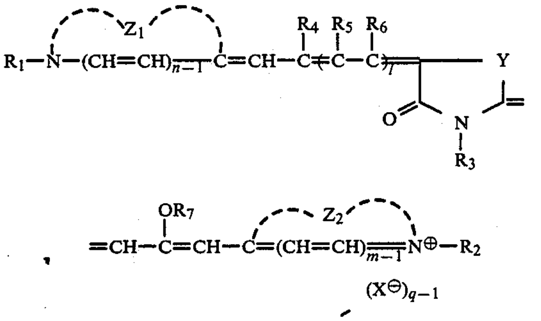
(I)

wherein $Z_1$ and $Z_2$ which may be identical or different represent a group of atoms which are necessary to form a 5- or 6-membered nitrogen containing heterocyclic ring; $R_1$, $R_2$ and $R_7$ which may be identical or different represent alkyl group or alkenyl group; $R_3$ represents alkyl group, alkenyl group or aryl group; $R_4$-$R_6$ which may be identical or different represent hydrogen atom, alkyl group or aryl group; l represents 0 or 1 with a proviso that when l is 1, $R_4$ and $R_6$ may link with each other to form a 5- or 6-membered ring; Y represents sulfur atom, oxygen atom or $>N-R_8$ ($R_8$ represents alkyl group); X represents acid anion; and m, n and q represent 1 or 2, General formula (II)

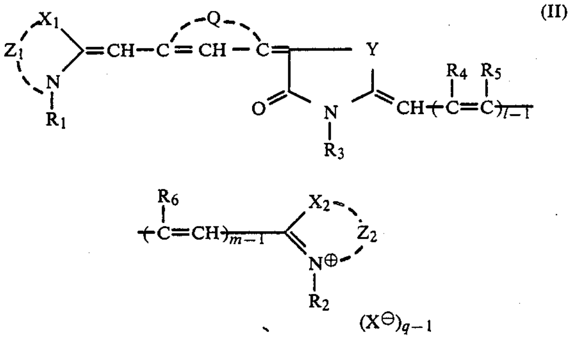
(II)

wherein $X_1$ and $X_2$ which may be identical or different represent oxygen atom, sulfur atom, selenium atom, $>N-R_7$ ($R_7$ represents an alkyl group) or

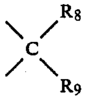

($R_8$ and $R_9$ represent alkyl group); $Z_1$ and $Z_2$ which may be identical or different represent a group of atoms necessary for forming a 5-membered nitrogen containing heterocyclic ring; $R_1$ and $R_2$ which may be identical or different represent alkyl group, or alkenyl group; $R_3$ represents an alkyl group, an alkenyl group or an aryl group; $R_4$, $R_5$ and $R_6$ which may be identical or different represent hydrogen atom, halogen atom, alkyl group or aryl group; Y represents sulfur atom, oxygen atom or $>N-R_{10}$ ($R_{10}$ represents an alkyl group); Q represents a group of atoms necessary for forming a 5- or 6-membered ring by linking with carbon atom of methine chain; X represents an acid anion; and l, m and q represent 1 or 2;

General formula (III)

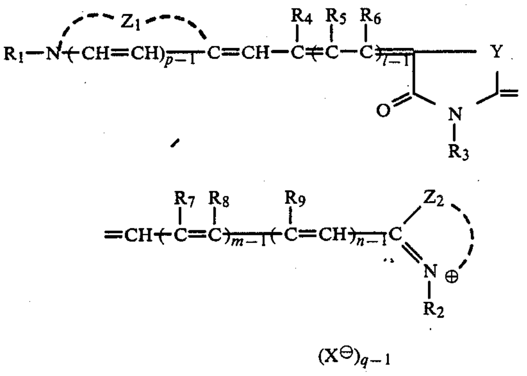
(III)

wherein $Z_1$ represents a group of atoms necessary for forming a 5- or 6-membered nitrogen containing heterocyclic ring; $Z_2$ represents a group of atoms necessary for forming a 5-membered nitrogen containing heterocyclic ring; $R_1$ and $R_2$ which may be identical or different represent alkyl group or alkenyl group; $R_3$ represents an alkyl group, an alkenyl group or an aryl group; $R_4$-$R_9$ which may be identical or different represent hydrogen atom, halogen atom, alkyl group or aryl group; Y represents sulfur atom, oxygen atom >N—$R_{10}$ ($R_{10}$ represents an alkyl group); X represents an acid anion; l, m, n, p and q represent 1 or 2 with a proviso that when m and n are both 1, l is 2;

General formula (IV)

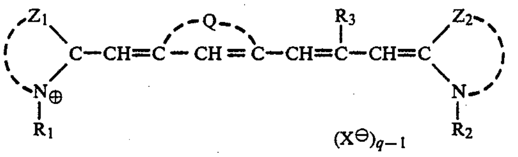
(IV)

wherein $Z_1$ and $Z_2$ which are different represent thiazole ring, selenazole ring or oxazole ring which may have a condensed ring; $R_1$ and $R_2$ which may be identical or different represent alkyl group or alkenyl group; $R_3$ represents hydrogen atom, an alkyl group or an aryl group; Q represents a group of atoms necessary for forming a 5- or 6-membered ring by linking with carbon atom of methine chain; X represents an acid anion; and q represents 1 or 2;

General formula (V)

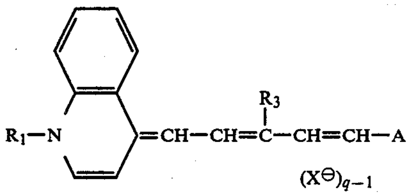
(V)

wherein A represents

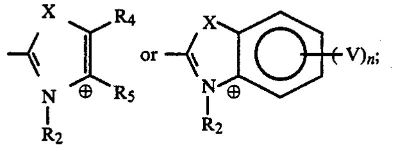

X represents sulfur atom, selenium atom, oxygen atom or N—$R_6$ ($R_6$ represents an alkyl group); $R_4$ and $R_5$ represent hydrogen atom, alkyl group or aryl group with a proviso that $R_4$ and $R_5$ cannot be both hydrogen atoms; V represents an alkyl group, an alkoxy group, an aryl group, an alkoxycarbonyl group, an alkenyl group, a carboxy group, hydroxy group or a halogen atom; n represents 0 or an integer of 1-4 and when n is O, V forms naphthothiazole ring; $R_1$ and $R_2$ represents alkyl group or alkenyl group; $R_3$ represents hydrogen atom, an alkyl group or an aryl group; X represents an acid anion; and q represents 1 or 2.

2. A light sensitive material for lithographic printing plate according to claim 1 wherein the silver halide emulsion layer additionally contains at least one of the compounds represented by the following general formulas (A) and (B):

General formula (A)

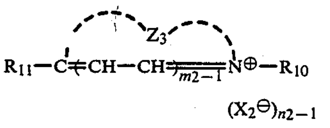
(A)

wherein $Z_3$ represents a group of atoms necessary for forming the 5- or 6-membered nitrogen containing heterocyclic ring; $R_{11}$ represents a hydrogen atom or alkyl or aryl group; $R_{10}$ represents an alkyl or alkenyl group; $X_2^-$ represents an acid anion with a proviso that if the compound has a betaine analogous structure, $X_2^-$ is not present; and $m_2$ and $n_2$ represent integers of 1 or 2;

General formula (B)

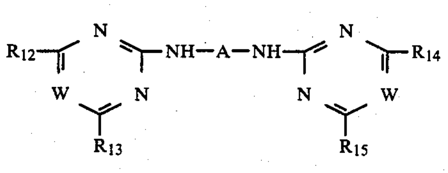

wherein A represents a divalent aromatic residue which may contain —$SO_3M$ (M represents hydrogen atom or a cation) with a proviso that when $R_{12}$-$R_{15}$ do not contain —$SO_3M$ group, A contains —$SO_3M$ group; $R_{12}$-$R_{15}$ represent hydrogen atom, hydroxyl group, aryloxy group, heterocyclic ring, alkylthio group, heterocyclicthio group, arylthio group, amino group, alkylamino group, arylamino group, heterocyclicamino group, aralkylamino group, mercapto group or halogen atom, alkyl group or alkoxy group; and W represents —CH= or —N=.

3. A light sensitive material according to claim 1 wherein the amount of the sensitizing dye is $1\times10^{-5}$-$1\times10^{-2}$ mole for 1 mole of silver halide.

4. A light sensitive material according to claim 1 wherein the silver halide comprises at least 50 mole % of silver chloride.

5. A light sensitive material according to claim 1 wherein the silver halide emulsion contains compounds of metals of Group VIII of the periodic table.

6. A light sensitive material according to claim 2 wherein the amount of the compound is $1\times10^{-4}$-$1\times10^{-1}$ mole for 1 mole of silver halide.

7. A light sensitive material according to claim 1 wherein a subbing layer and/or an undercoat layer are provided between the silver halide emulsion layer and the support.

8. A plate making method which comprises imagewise exposing the light sensitive material of claim 1 and then developing it with a diffusion transfer developer.

9. A plate making method according to claim 8 wherein the imagewise exposure is carried out with a semiconductor laser beam.

10. A lithographic printing plate which comprises a support and at least a silver halide emulsion layer and a surface physical development nuclei layer provided on said support, said surface physical development nuclei layer having silver image formed by imagewise exposure and diffusion transfer development and said silver halide emulsion layer containing at least one of the sensitizing dyes represented by the following general formulas (I), (II), (III), (IV) and (V):

General formula (I)

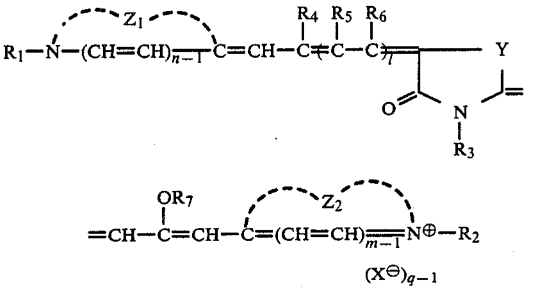

(I)

wherein $Z_1$ and $Z_2$ which may be identical or different represent a group of atoms which are necessary to form a 5- or 6-membered nitrogen containing heterocyclic ring; $R_1$, $R_2$ and $R_7$ which may be identical or different represent alkyl group or alkenyl group; $R_3$ represents alkyl group, alkenyl group or aryl group; $R_4$–$R_6$ which may be identical or different represent hydrogen atom, alkyl group or aryl group; l represents 0 or 1 with a proviso that when l is 1, $R_4$ and $R_6$ may link with each other to form a 5- or 6-membered ring; Y represents sulfur atom, oxygen atom or $>N—R_8$ ($R_8$ represents alkyl group); X represents acid anion; and m, n and q represent 1 or 2;

General formula (II)

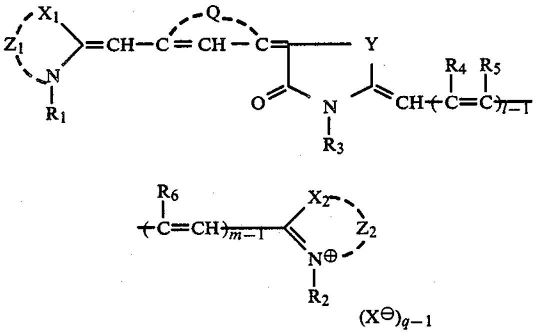

(II)

wherein $X_1$ and $X_2$ which may be identical or different represent oxygen atom, sulfur atom, selenium atom, $>N—R_7$ ($R_7$ represents an alkyl group) or

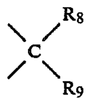

($R_8$ and $R_9$ represent alkyl group); $Z_1$ and $Z_2$ which may be identical or different represent a group of atoms necessary for forming a 5-membered nitrogen containing heterocyclic ring; $R_1$ and $R_2$ which may be identical or different represent alkyl group, or alkenyl group; $R_3$ represents an alkyl group, an alkenyl group or an aryl group; $R_4$, $R_5$ and $R_6$ which may be identical or different represent hydrogen atom, halogen atom, alkyl group or aryl group; Y represents sulfur atom, oxygen atom or $>N—R_{10}$ ($R_{10}$ represents an alkyl group); Q represents a group of atoms necessary for forming a 5- or 6-membered ring by linking with carbon atom of methine chain; X represents an acid anion; and l, m and q represent 1 or 2;

General formula (III)

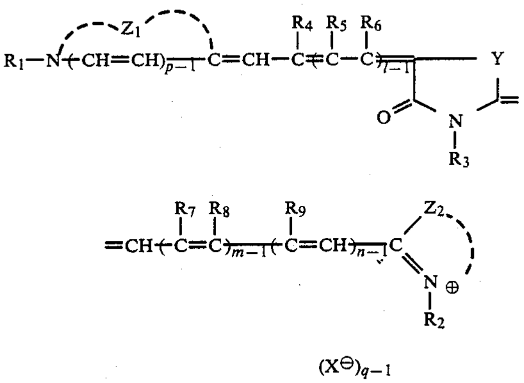

(III)

wherein $Z_1$ represents a group of atoms necessary for forming a 5- or 6-membered nitrogen containing heterocyclic ring; $Z_2$ represents a group of atoms necessary for forming a 5-membered nitrogen containing heterocyclic ring; $R_1$ and $R_2$ which may be identical or different represent alkyl group or alkenyl group; $R_3$ represents an alkyl group, an alkenyl group or an aryl group; $R_4$–$R_9$ which may be identical or different represent hydrogen atom, halogen atom, alkyl group or aryl group; Y represents sulfur atom, oxygen atom $>N—R_{10}$ ($R_{10}$ represents an alkyl group); X represents an acid anion; l, m, n, p and q represent 1 or 2 with a proviso that when m and n are both 1, l is 2;

General formula (IV)

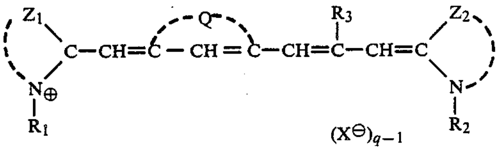

(IV)

wherein $Z_1$ and $Z_2$ which are different represent thiazole ring, selenazole ring or oxazole ring which may have a condensed ring; $R_1$ and $R_2$ which may be identical or different represent alkyl group or alkenyl group; $R_3$ represents hydrogen atom, an alkyl group or an aryl group; Q represents a group of atoms necessary for forming a 5- or 6-membered ring by linking with carbon atom of methine chain; X represents an acid anion; and q represents 1 or 2;

General formula (V)

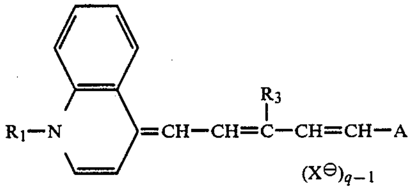

(V)

wherein A represents

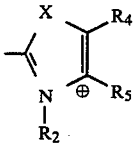

or

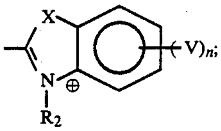

X represents sulfur atom, selenium atom, oxygen atom or N—$R_6$ ($R_6$ represents an alkyl group); $R_4$ and $R_5$ represent hydrogen atom, alkyl group or aryl group with a proviso that $R_4$ and $R_5$ cannot be both hydrogen atoms; V represents an alkyl group, an alkoxy group, an aryl group, an alkoxycarbonyl group, an alkenyl group, a carboxy group, hydroxy group or a halogen atom; n represents 0 or an integer of 1–4 and when n is 0, V forms naphthothiazole ring; $R_1$ and $R_2$ represent alkyl group or alkenyl group; $R_3$ represents hydrogen atom, an alkyl group or an aryl group; X represents an acid anion; and q represents 1 or 2.

11. A method of printing which comprises mounting the lithographic printing plate of claim 10 on an offset printing machine and carrying out printing with a damping solution.

12. A lithographic printing plate according to claim 10 which comprises a light sensitive material wherein the silver halide emulsion layer additionally contains at least one of the compounds represented by the following general formulas (A) and (B):

General formula (A)

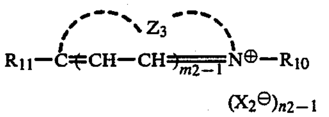

(A)

wherein $Z_3$ represents a group of atoms necessary for forming the 5- or 6-membered nitrogen containing heterocyclic ring; $R_{11}$ represents hydrogen atom or alkyl or aryl group; $R_{10}$ represents an alkyl or alkenyl group; $X_2^-$ represents an acid anion with a proviso that if the compound has a betaine analogous structure, $X_2^-$ is not present; and $m_2$ and $n_2$ represent integers of 1 or 2;

General formula (B)

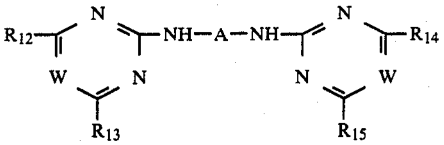

wherein A represents a divalent aromatic residue which may contain —$SO_3M$ (M represents hydrogen atom or a cation) with a proviso that when $R_{12}$–$R_{15}$ do not contain —$SO_3M$ group, A contains —$SO_3M$ group; $R_{12}$–$R_{15}$ represent hydrogen atom, hydroxyl group, aryloxy group, heterocyclic ring, alkylthio group, heterocyclicthio group, arylthio group, amino group, alkylamino group, arylamino group, heterocyclicamino group, aralkylamino group, mercapto group or halogen atom, alkyl group or alkoxy group; and W represents —CH= or —N=.

13. A lithographic printing plate according to claim 10 wherein the amount of the sensitizing dye is $1\times10^{-5}$–$1\times10^{-2}$ mole for 1 mole of silver halide.

14. A lithographic printing plate according to claim 10 wherein the silver halide comprises at least 50 mole % of silver chloride.

15. A lithographic printing plate according to claim 10 wherein the silver halide emulsion contains compounds of metals of Group VIII of the periodic table.

16. A lithographic printing plate according to claim 12 wherein the amount of the compound is $1\times10^{-4}$–$1\times10^{-1}$ mole for 1 mole of silver halide.

17. A lithographic printing plate according to claim 10 wherein a subbing layer and/or an undercoat layer are provided between the silver halide emulsion layer and the support.

* * * * *